United States Patent
Coppock et al.

(10) Patent No.: US 6,930,010 B1
(45) Date of Patent: Aug. 16, 2005

(54) METHOD OF FORMING A CONDUCTIVE STRUCTURE IN A SEMICONDUCTOR MATERIAL

(75) Inventors: William M. Coppock, Arlington, TX (US); Charles A. Dark, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/950,774

(22) Filed: Sep. 27, 2004

Related U.S. Application Data

(62) Division of application No. 10/371,479, filed on Feb. 20, 2003, now Pat. No. 6,815,714.

(51) Int. Cl.[7] .......................................... H01L 21/331
(52) U.S. Cl. ..................... 438/348; 438/134; 438/309; 438/345; 438/350; 438/427
(58) Field of Search ............................... 438/134, 309, 438/345, 348, 350, 584; 257/119, 126, 127, 257/154, 515, 517, 526, 550, 584, 587, 592

(56) References Cited

U.S. PATENT DOCUMENTS

| | | | | |
|---|---|---|---|---|
| 4,808,550 A | * | 2/1989 | Fukushima | 438/427 |
| 5,200,639 A | | 4/1993 | Ishizuka et al. | 257/508 |
| 5,665,630 A | | 9/1997 | Ishizuka et al. | 438/620 |
| 6,144,040 A | | 11/2000 | Ashton | 257/48 |
| 6,365,447 B1 | | 4/2002 | Hebert et al. | 438/203 |
| 6,472,709 B1 | | 10/2002 | Blanchard | 257/343 |
| 6,798,037 B2 | * | 9/2004 | Leonardi | 257/507 |
| 2002/0125527 A1 | | 9/2002 | Blanchard | 257/328 |
| 2002/0142507 A1 | | 10/2002 | Egashira | 438/48 |
| 2003/0042574 A1 | * | 3/2003 | Schwartzmann | 257/573 |

* cited by examiner

*Primary Examiner*—Andy Huynh
(74) *Attorney, Agent, or Firm*—Mark C. Pickering

(57) ABSTRACT

A conductive structure provides a conductive path from a first region in a semiconductor material to a second spaced apart region in the semiconductor material by forming one or more trenches between the first and second regions, and implanting a dopant into the bottom surfaces of the trenches to form a continuous conductive path.

18 Claims, 28 Drawing Sheets

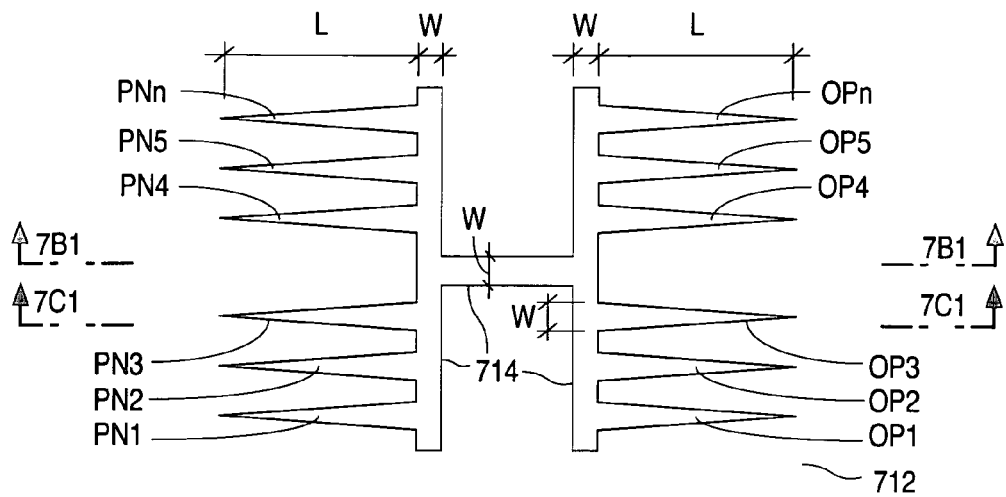
FIG. 7A
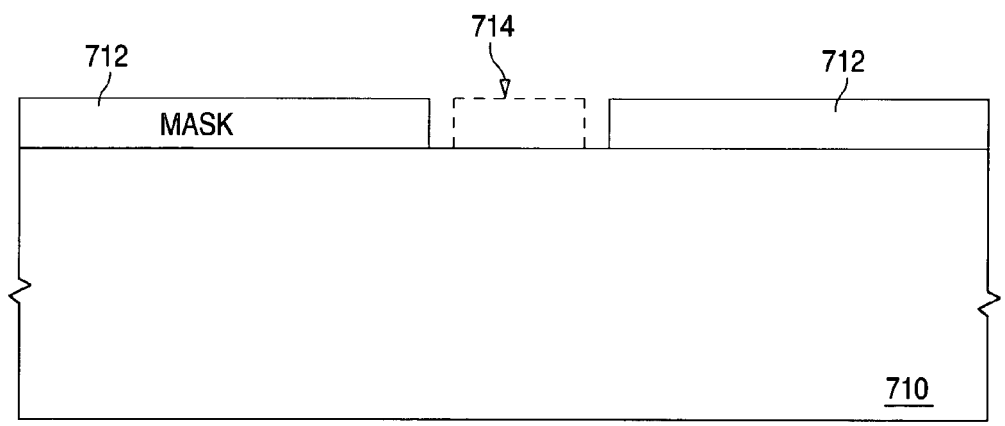
FIG. 7B1
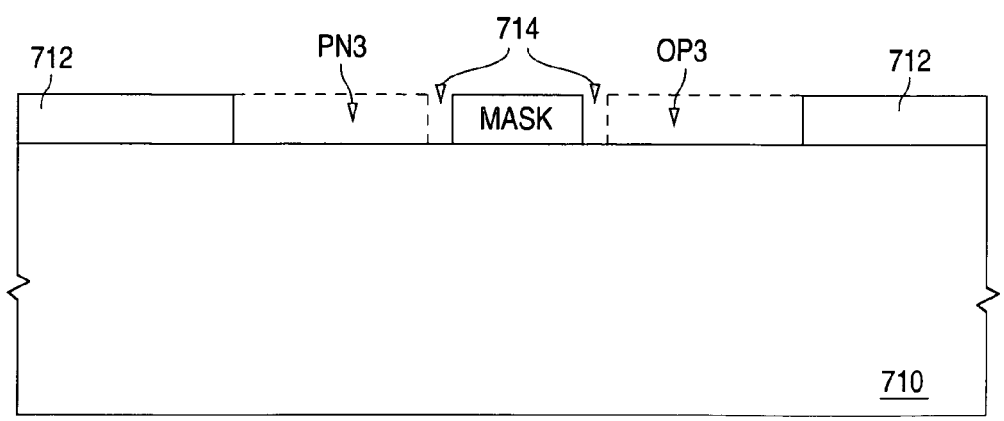
FIG. 7B2

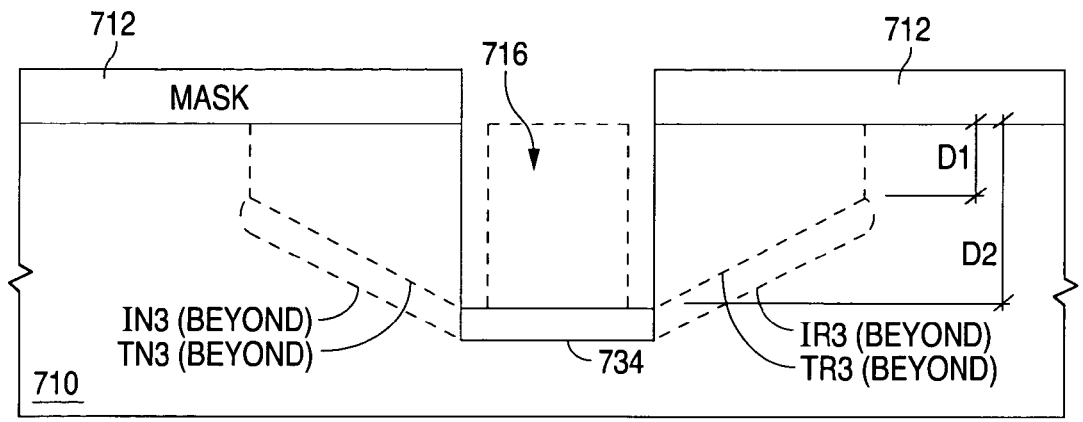
FIG. 7C1
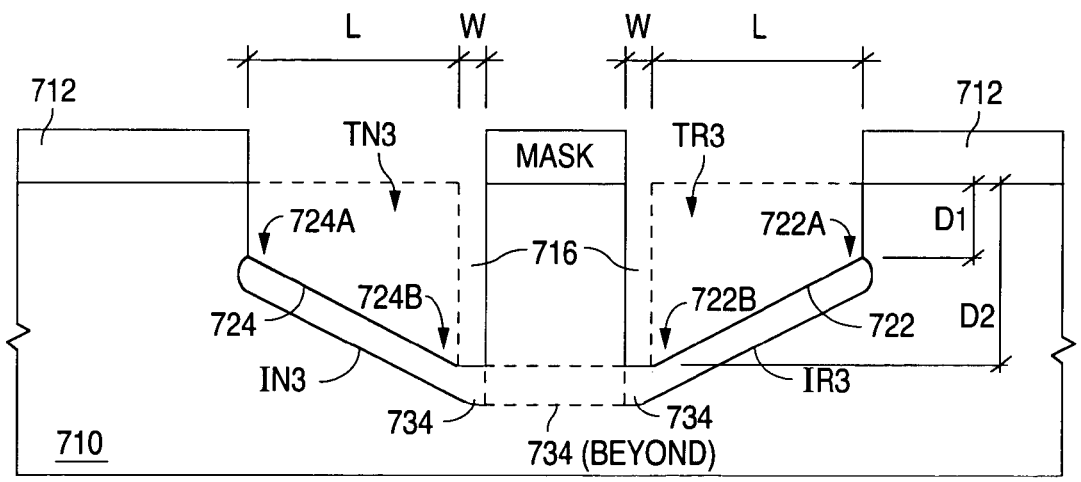
FIG. 7C2

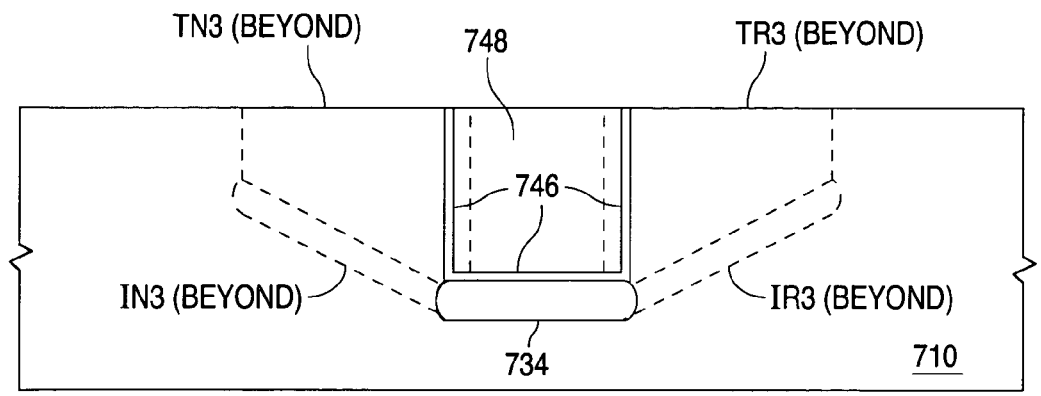
FIG. 7D1
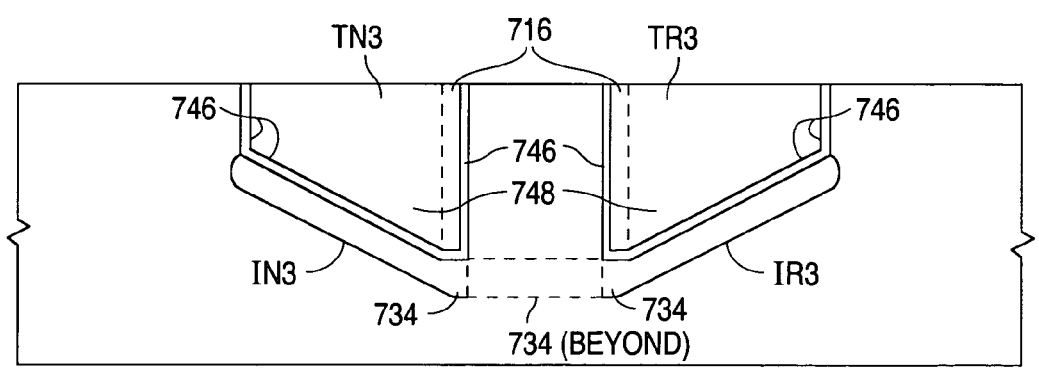
FIG. 7D2

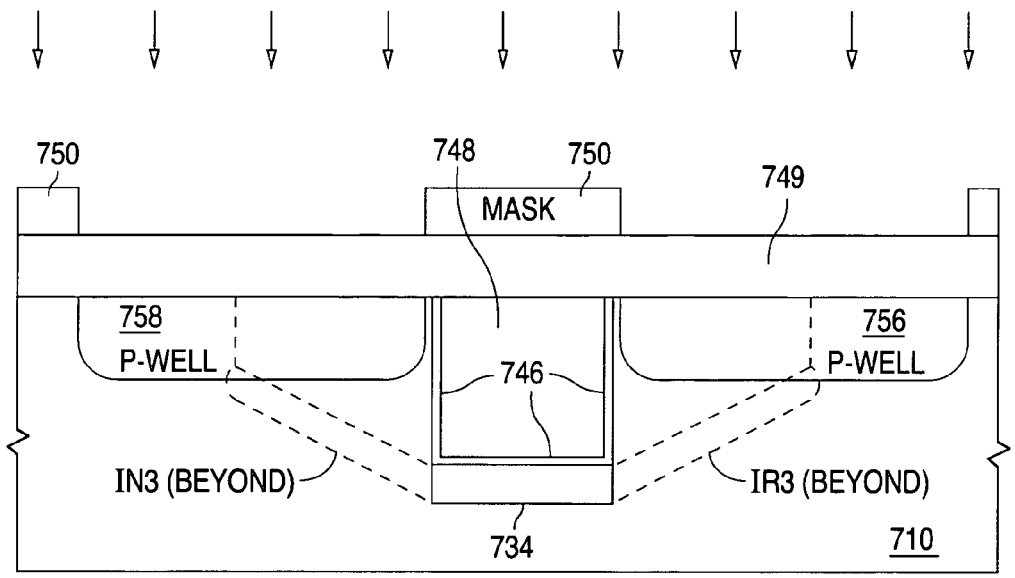
FIG. 7E1
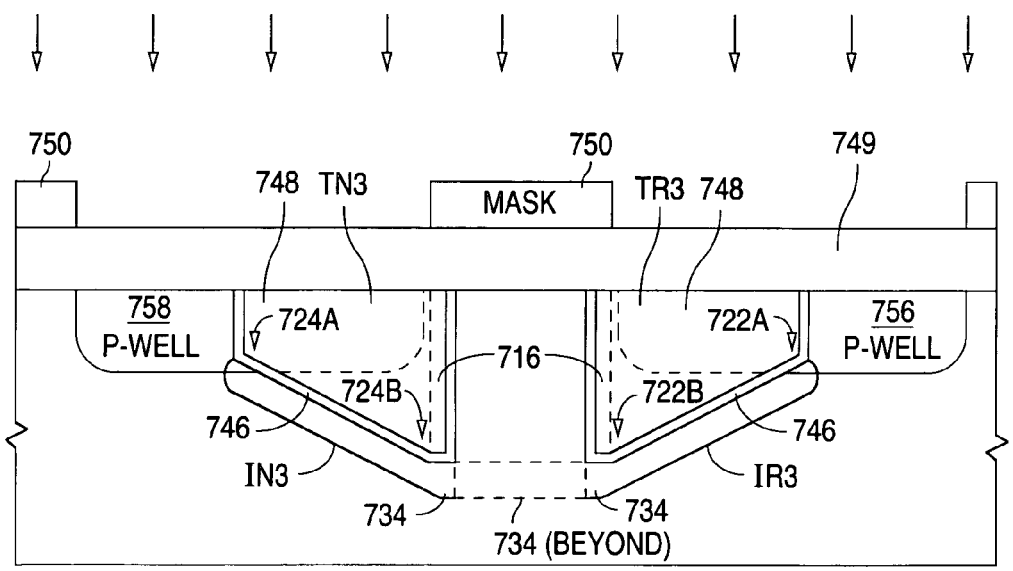
FIG. 7E2

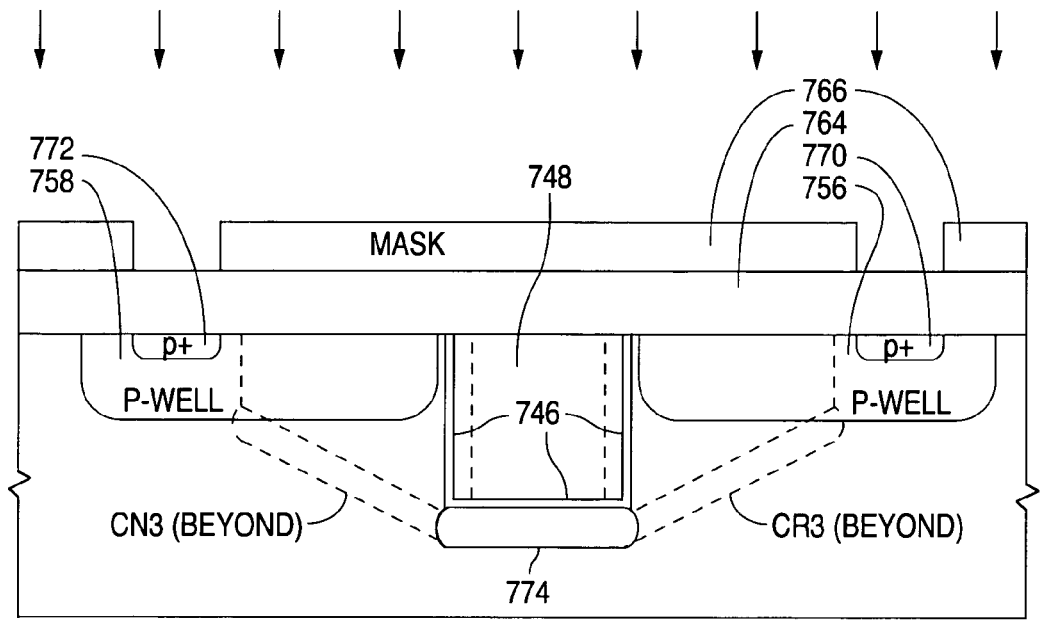
FIG. 7F1
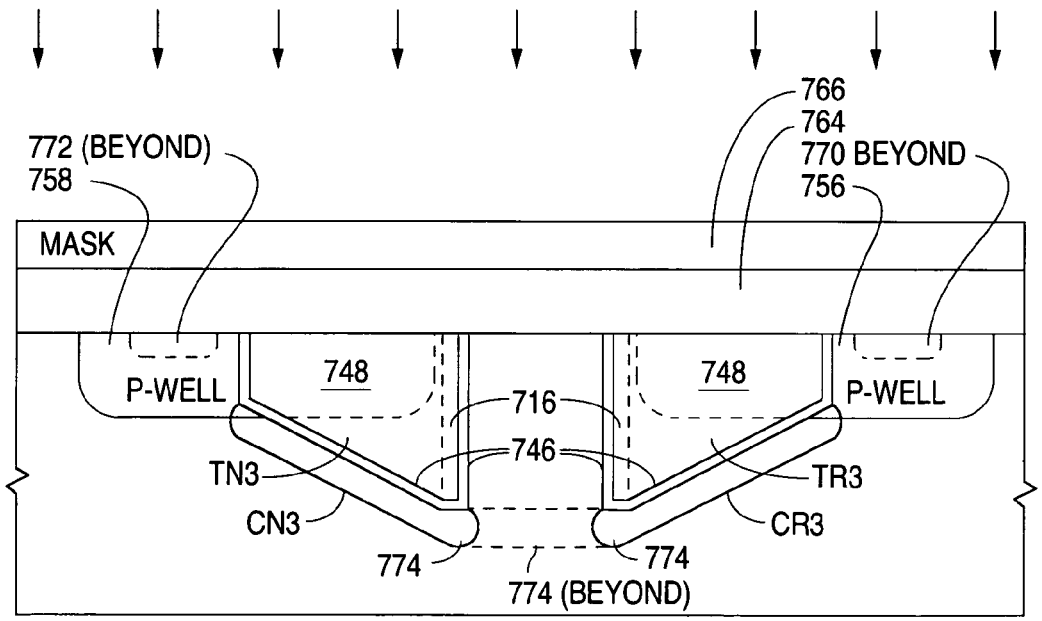
FIG. 7F2

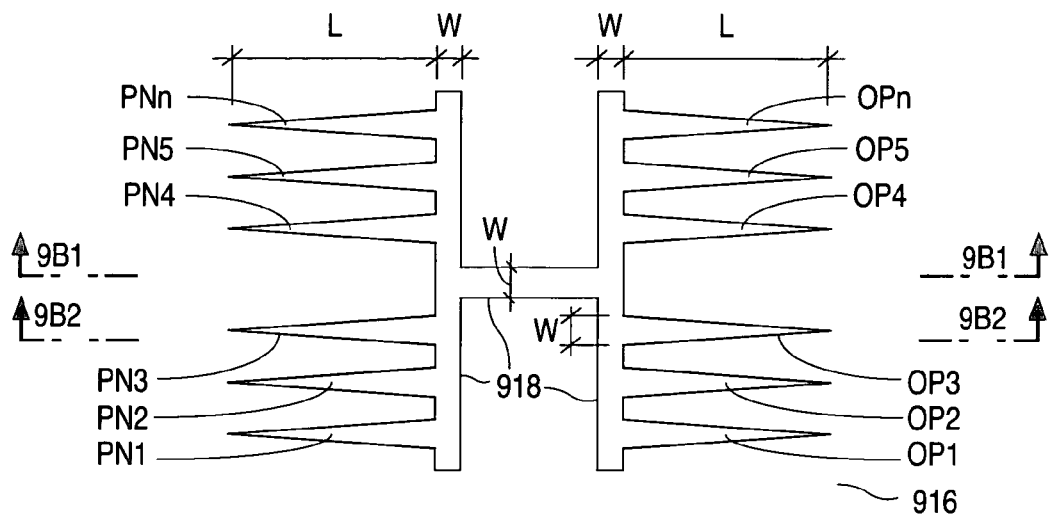
FIG. 9A
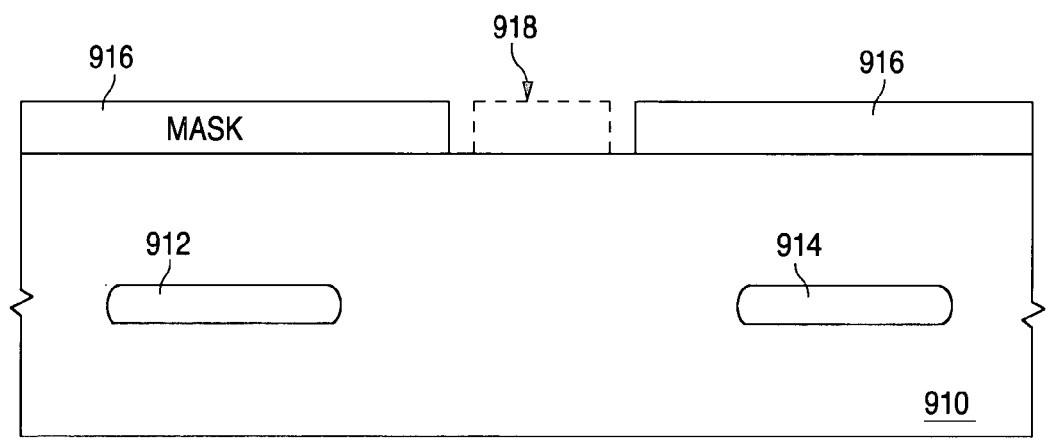
FIG. 9B1
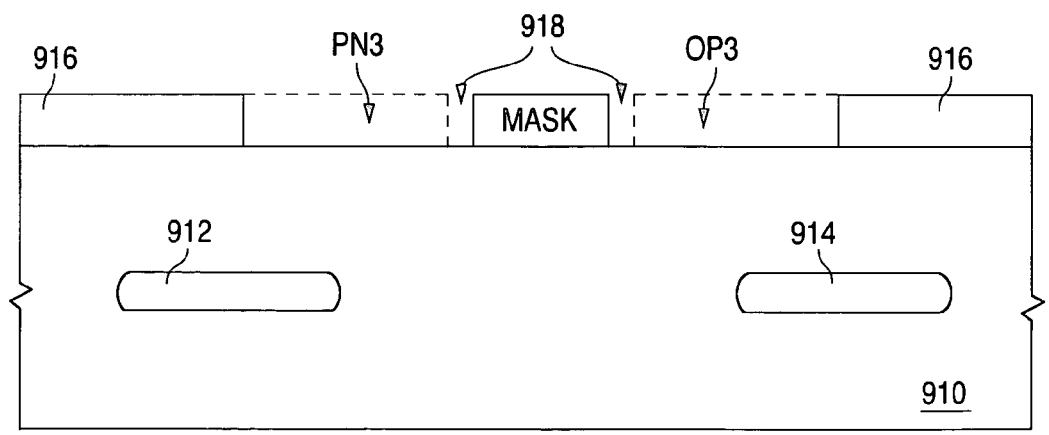
FIG. 9B2

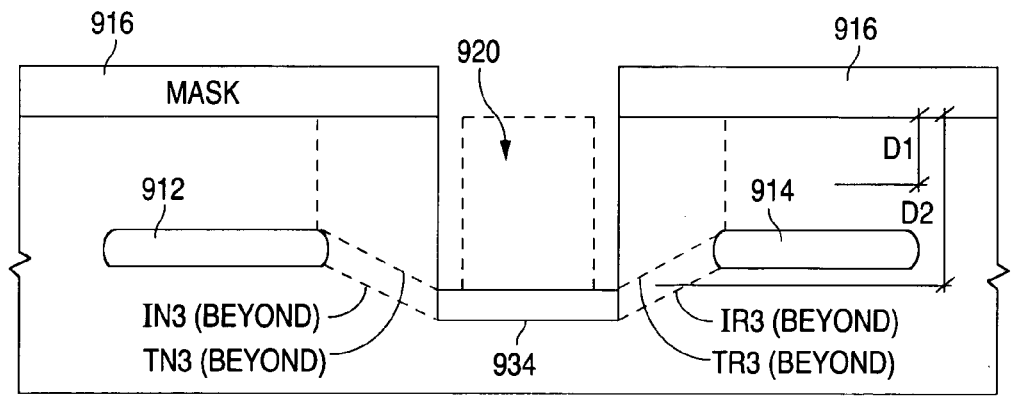
FIG. 9C1
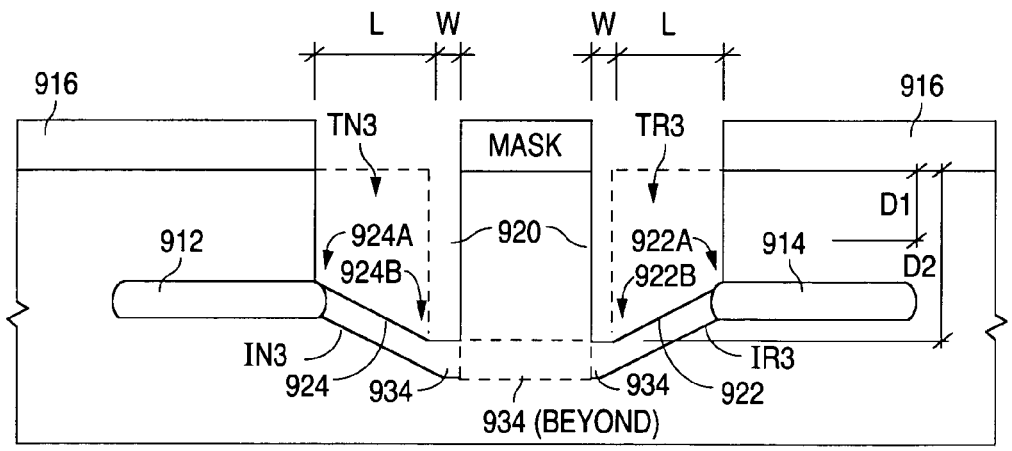
FIG. 9C2

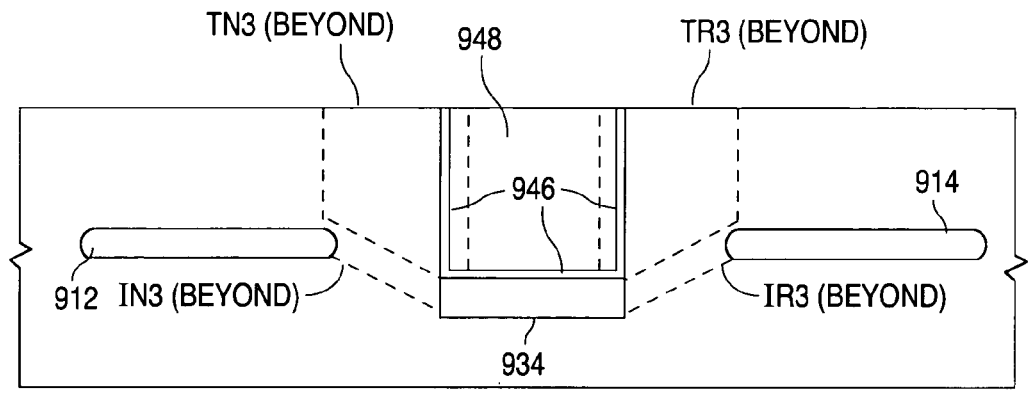
FIG. 9D1
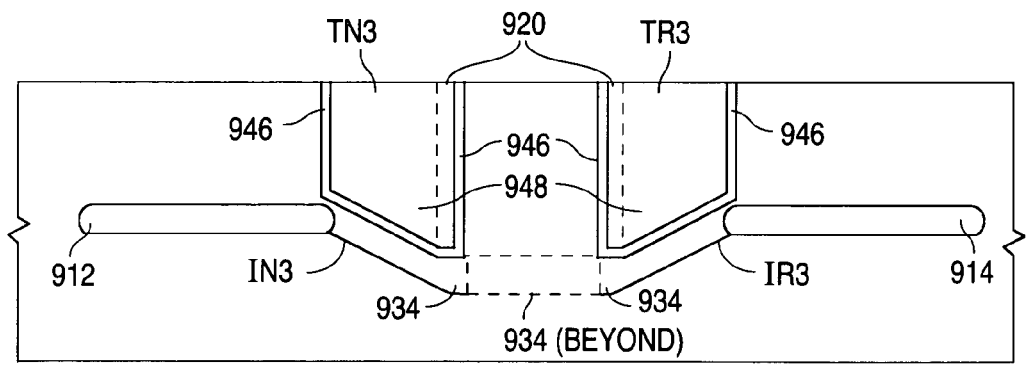
FIG. 9D2

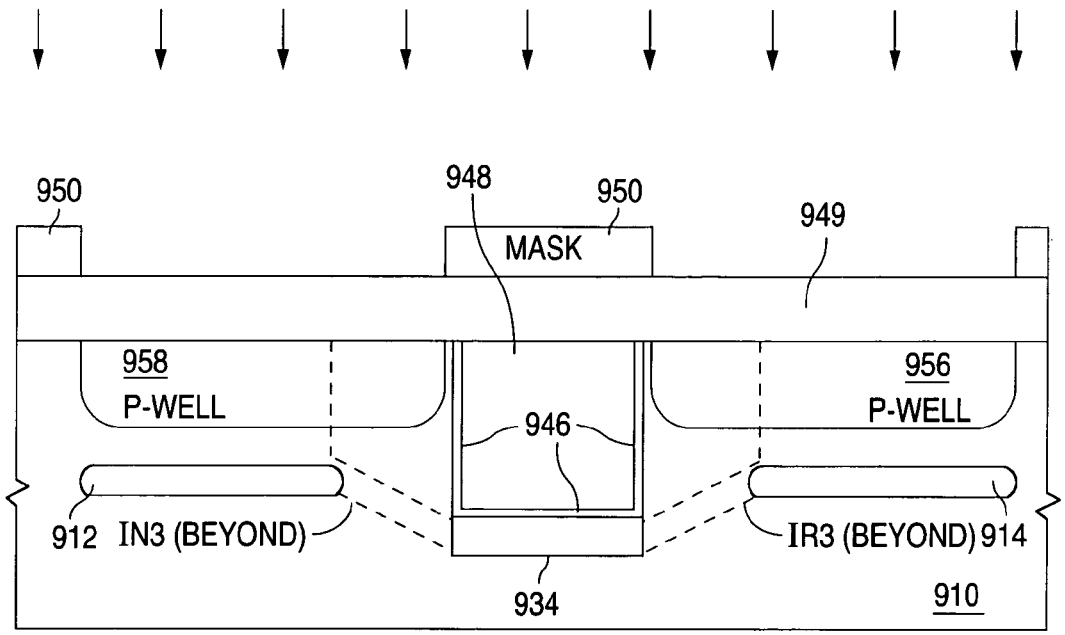
FIG. 9E1
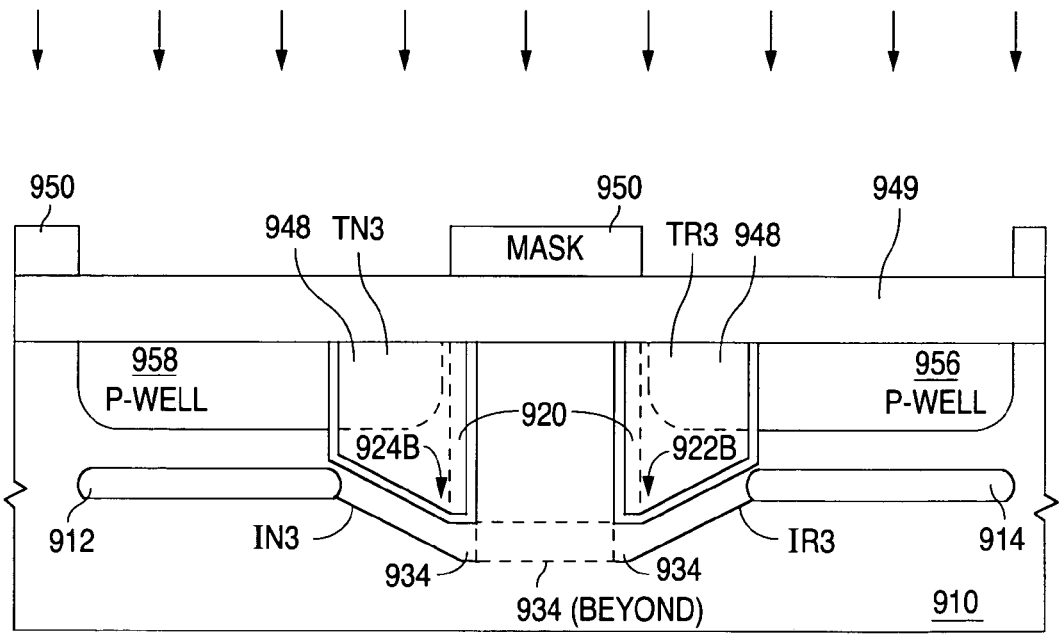
FIG. 9E2

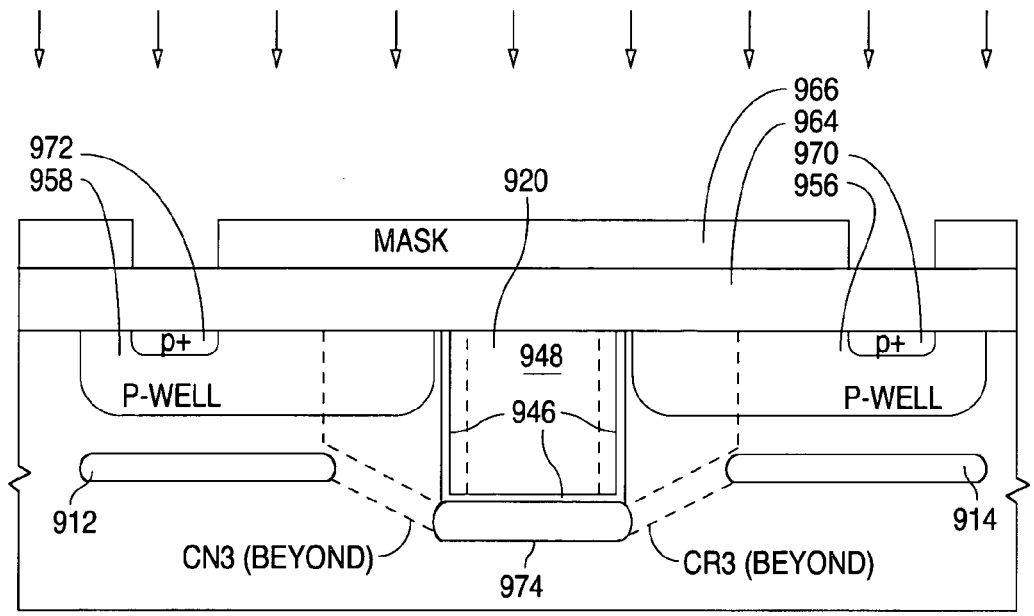
FIG. 9F1
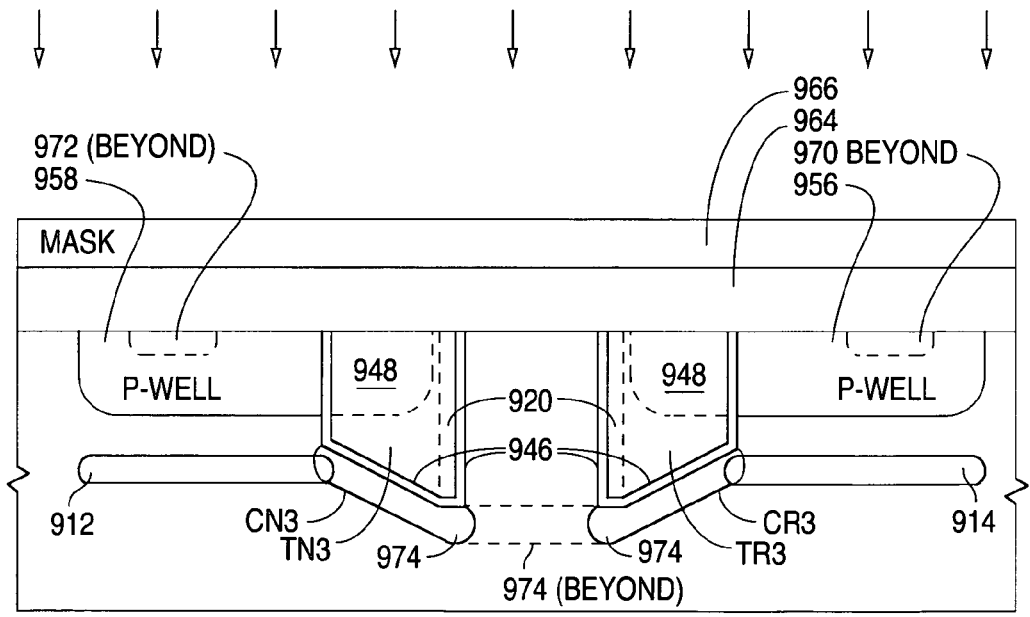
FIG. 9F2

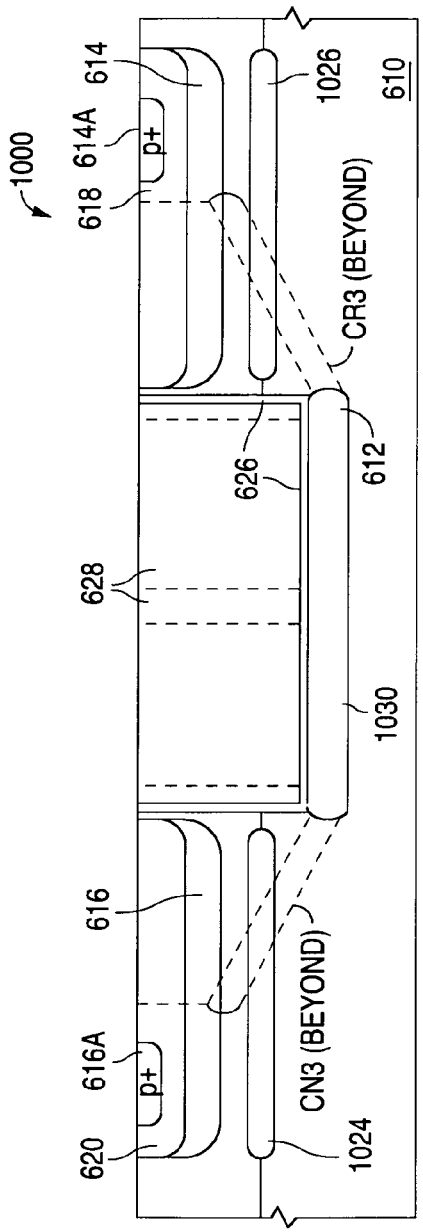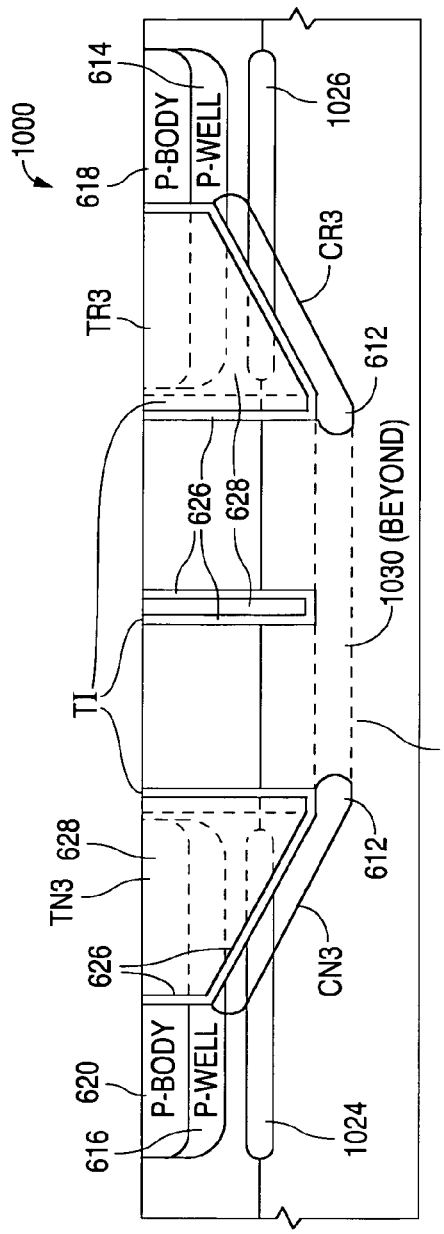
FIG. 10B
FIG. 10C

METHOD OF FORMING A CONDUCTIVE STRUCTURE IN A SEMICONDUCTOR MATERIAL

RELATED APPLICATION

This is a divisional application of application Ser. No. 10/371,479 filed on Feb. 20, 2003 now U.S. Pat. No. 6,815,714.

The present invention is related to application Ser. No. 10/371,431 for "Conductive Structure and Method of Forming the Structure" by Charles A. Dark and William M. Coppock filed on Feb. 20, 2003.

BRIEF DESCRIPTION OF THE DRAWINGS

FIGS. 7A–7F2 are views illustrating an example of a method of forming a conductive structure in accordance with the present invention.

FIGS. 9A–9F2 are cross-sectional views illustrating an example of a method of forming a conductive structure in accordance with the present invention.

FIGS. 10A–10C are views illustrating an example of a conductive structure 1000 in accordance with the present invention.

DETAILED DESCRIPTION OF THE INVENTION

Figure 1A:
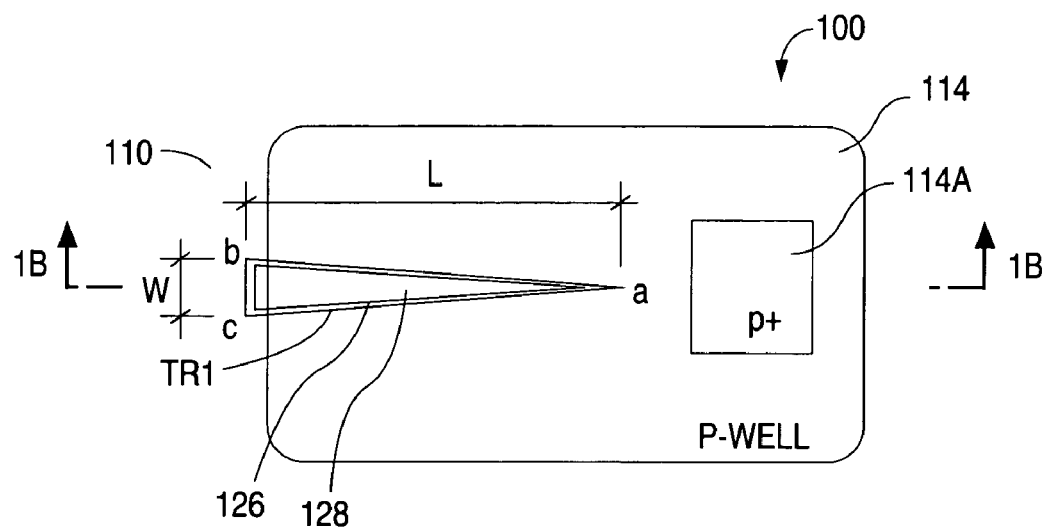
FIGS. 1A–1C are views illustrating an example of a conductive structure 100 in accordance with the present invention.
Figure 1B:
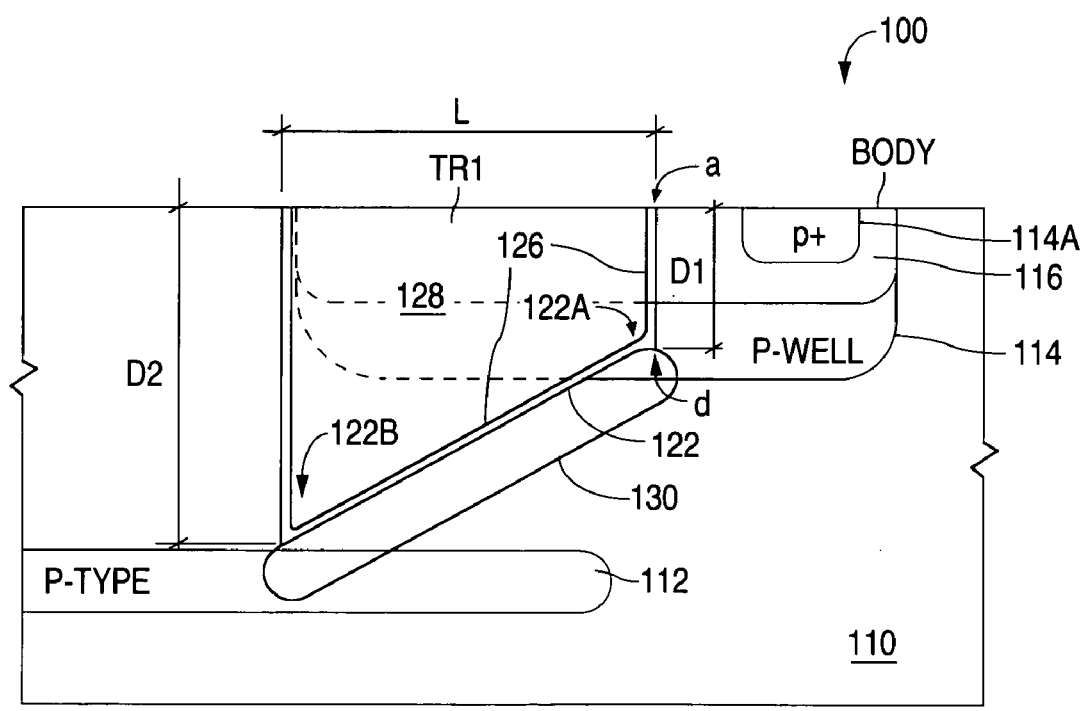
Figure 1C:
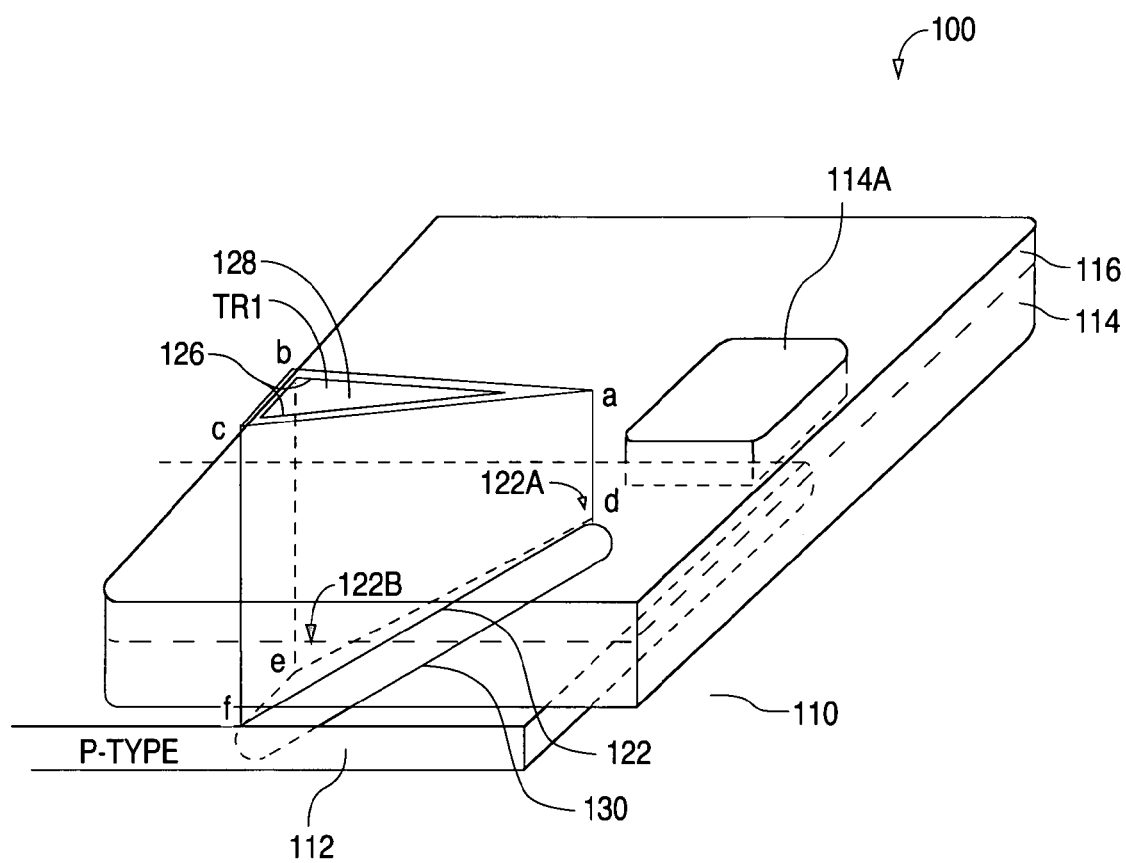

FIGS. 1A–1C show views that illustrate an example of a conductive structure 100 in accordance with the present invention. FIG. 1A is a plan view; FIG. 1B is a cross-sectional view taken along line 1B—1B of FIG. 1A; and FIG. 1C is a perspective view. Conductive structure 100, which is formed in a semiconductor material 110, includes first and second p-type conductive regions 112 and 114, respectively, that are formed in material 110. Examples of semiconductor material 110 include an n-type substrate, an n-type epitaxial layer, and an epitaxial layer on an n-type substrate. Conductive regions 112 and 114 are vertically spaced apart, and can be horizontally spaced apart as shown.

In the example shown in FIGS. 1A–1C, conductive region 112 is formed as a p-type subsurface region in an n-type portion of semiconductor material 110, while second conductive region 114 is formed as a p-type well that contacts the top surface of semiconductor material 110. First conductive region 112 can be implemented as, for example, a buried region or a channel stop region.

In addition, structure 100 can include a contact region 114A that is formed in second conductive region 114. Region 114A has a higher dopant concentration that region 114. For example, region 114 can have a p dopant concentration, while contact region 114A can have a p+ dopant concentration.

Further, structure 100 can optionally include a p-body region 116 that is formed in well 114. Region 116 has a slightly higher dopant concentration than well 114. Further, p-body region 116 is approximately the same size and shape in plan view as well 114.

As further shown in FIGS. 1A–1C, conductor 100 also includes a wedge shaped trench TR1 that is formed in semiconductor material 110 such that a bottom surface 122 of trench TR1 is formed between first and second conductive regions 112 and 114. The top of trench TR1 is defined by points 'a', 'b', and 'c' on the top surface of semiconductor material 110. The bottom of trench TR1, bottom surface 122, is defined by points 'd', 'e', and 'f' in semiconductor material 110.

The width and depth of trench TR1 increase between region 114 and region 112. Bottom surface 122 slopes down from a first depth D1 at point 'd' in region 114, to a second, overall depth D2 at segment 'e–f' adjoining or nearly adjoining region 112. Additionally, bottom surface 122 increases in width, from zero at point 'd', to a width W at segment 'e–f'. (Although trench TR1 is shown in the example to have a triangular shape in plan view, the trench can alternately be formed as a trapezoid in plan view by substituting a line segment having a width less than W for points 'a' and 'd'.)

Trench TR1 is formed using a process of aspect ratio dependent etching, so that the depth of the trench increases as the width of the trench increases. In the example shown in FIGS. 1A–1C, trench TR1 has a width W that is sufficient to locate the deepest portion of the trench, segment 'e–f', adjacent to conductive region 112. Alternately, a wider and deeper trench, or a narrower and shallower trench can be utilized to approach regions located at other depths.

Conductive structure 100 additionally includes a conductor 130 that electrically connects first and second regions 112 and 114. Conductor 130 is formed in semiconductor material 110 below the bottom surface of trench TR1, and can be implemented with a p-type dopant. Further, although conductive region 112 is described as having a p-type conductivity in an n-type material, the present invention applies when the conductivity types of the materials are reversed.

As further shown in FIGS. 1A and 1B, conductive structure 100 also includes a layer of isolation material 126 that lines trench TR1, and a region of filler material 128 that is formed on isolation material 126 to fill trench TR1. Isolation layer 126 can be implemented with, for example, an oxide, while filler region 128 can be implemented with, for example, polysilicon or oxide.

In operation, when a first potential is present on conductive region 112 and a higher second potential is present on conductive region 114, a current flows from region 114 to region 112 via conductor 130.

One advantage of the present invention is that by forming trench TR1 with an increasing depth, the present invention allows conductive regions that lie at different depths in the semiconductor material to be connected together. For example, conductive structure 100 can be used in lieu of a deep vertical conductor, such as a sinker.

Figure 2A:
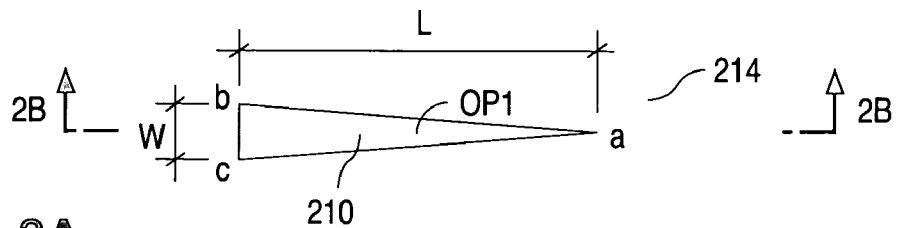
FIGS. 2A–2G are a series of cross-sectional views illustrating an example of a method of forming a conductive structure in accordance with the present invention.
Figure 2B:
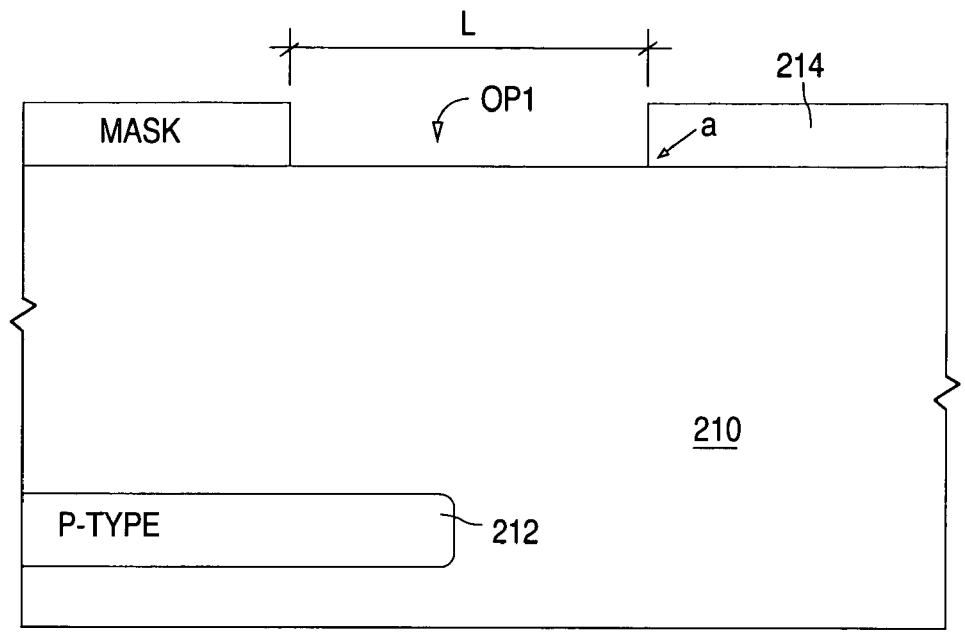

FIGS. 2A–2G show a series of views that illustrate an example of a method of forming a conductive structure in accordance with the present invention. FIG. 2A is a plan view, while FIGS. 2B–2G are cross-sectional views taken along line 2B—2B of FIG. 2A. As shown in FIGS. 2A and 2B, the method uses a conventionally formed semiconductor material 210, such as a substrate or an epitaxial layer on a substrate, that has a p-type subsurface conductive region 212 formed in an n-type portion of material 210.

As further shown in FIGS. 2A and 2B, the method begins by forming a mask 214 on semiconductor material 210. The mask is patterned to have an opening OP1 that is shaped like a triangle in plan view. In the example, opening OP1 is formed so that two points, 'b' and 'c', of the triangle overlie conductive region 212, and a third point, 'a', of the triangle is laterally and vertically spaced apart from conductive region 212.

Mask opening OP1 is also formed to have a width W between points 'b' and 'c', and a width of zero at point 'a'. Opening OP1 also has a length L that is defined by the distance between segment 'b–c' and point 'a'. (Alternatively, the opening can be formed as a trapezoid having two first points overlying region 212 and two second points laterally spaced apart from the first two points).

Figure 2C:
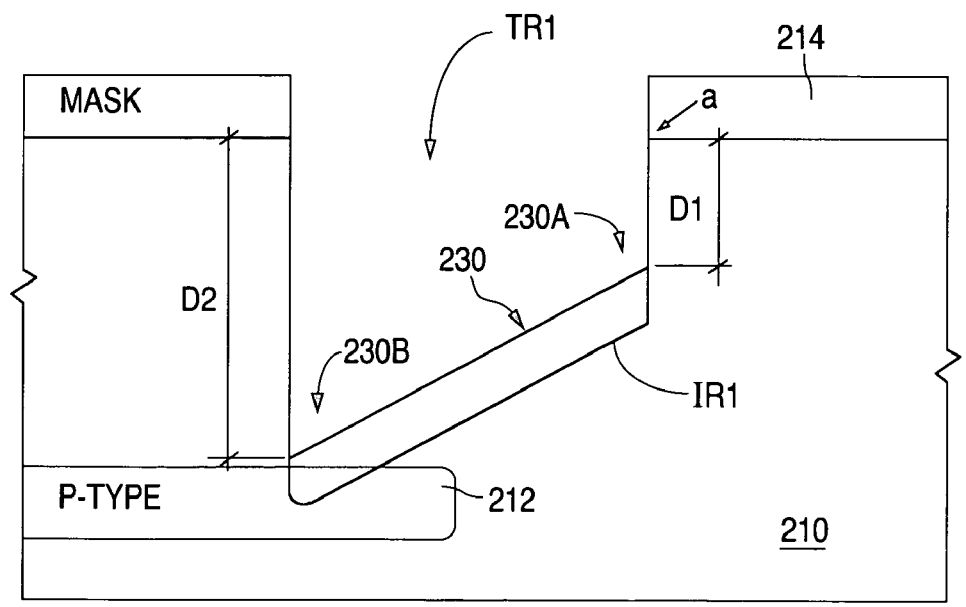

Next, as shown in FIG. 2C, semiconductor material 210 is anisotropically etched to remove the material not protected by mask 214, thereby forming a wedge shaped trench TR1. Since the width of trench TR1 varies, the trench depth also varies due to aspect ratio dependent etching. In this case, the depth of the trench is determined by the width of the mask opening; a wider opening yielding a deeper trench.

In the FIG. 2C example, trench TR1 is formed to have three substantially vertical sidewalls, and a sloped bottom surface 230. (Alternately, if a trapezoidal mask opening is used, the trench will have four sidewalls). Bottom surface 230 has a depth D1 at a shallow end 230A of trench TR1, and a depth D2, which is greater than D1, at a deep end 230B of the trench adjacent to conductive region 212. (Although trench TR1 is shown to have a depth D2, the trench can alternately be formed with increased width and depth to extend deeper into the semiconductor material to connect with a deeper subsurface conductive region.)

As further shown in FIG. 2C, after trench TR1 has been formed, the bottom surface 230 of trench TR1 is then implanted with a p-type dopant, such as boron, to form an implanted region IR1 that lies below the bottom surface 230 of trench TR1. Implanted region IR1 contacts (or nearly contacts) conductive region 212. Following this, mask 214 is removed.

Figure 2D:
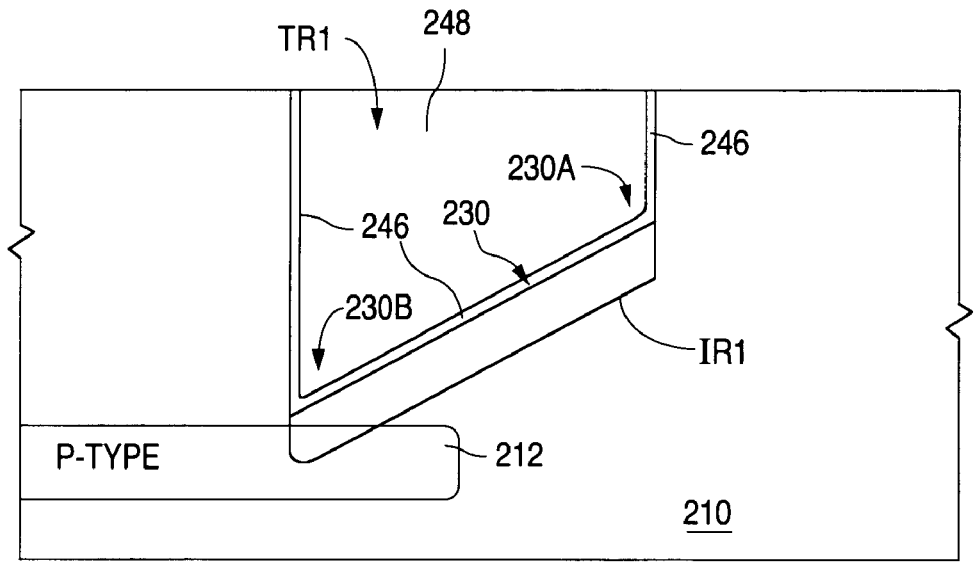

Turning to FIG. 2D, after mask 214 has been removed, a layer of isolation material 246, such as thermally grown oxide, is formed on semiconductor material 210 and trench TR1 to line trench TR1. After trench TR1 has been lined, a layer of filler material 248, such as oxide or polysilicon, is formed on material 246 to fill trench TR1. Once filled, materials 246 and 248 are planarized to remove filler material 248 and isolation material 246 from the top surface of semiconductor material 210.

Figure 2E:
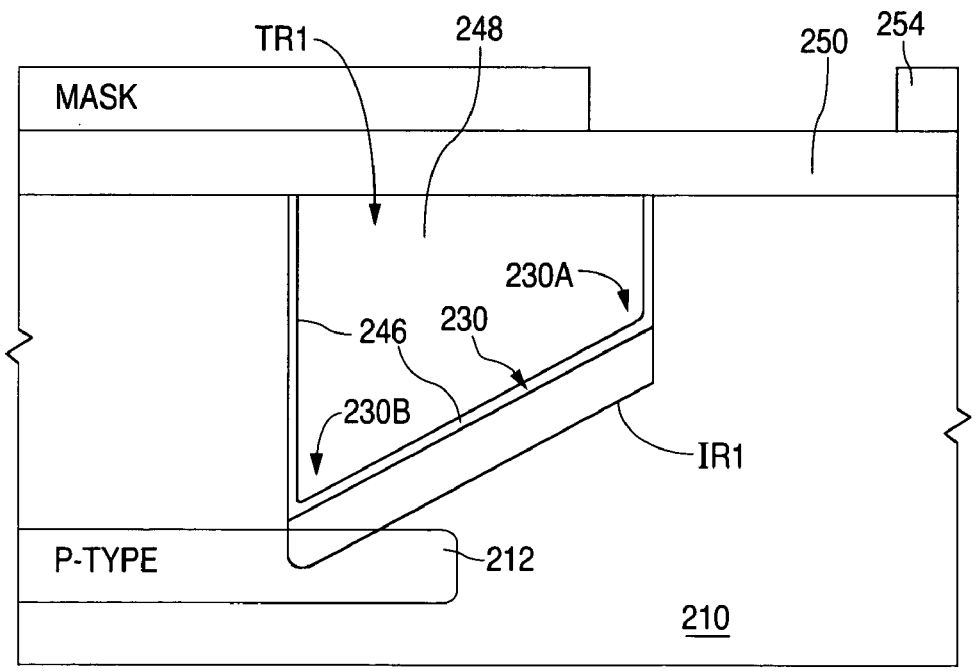

After this step, as shown in FIG. 2E, an insulating layer 250, such as sacrificial oxide, is formed on semiconductor material 210 and the top surfaces of isolation material 246 and filler material 248 in trench TR1. Following this, a mask 254 is formed and patterned on layer 250.

Figure 2F:
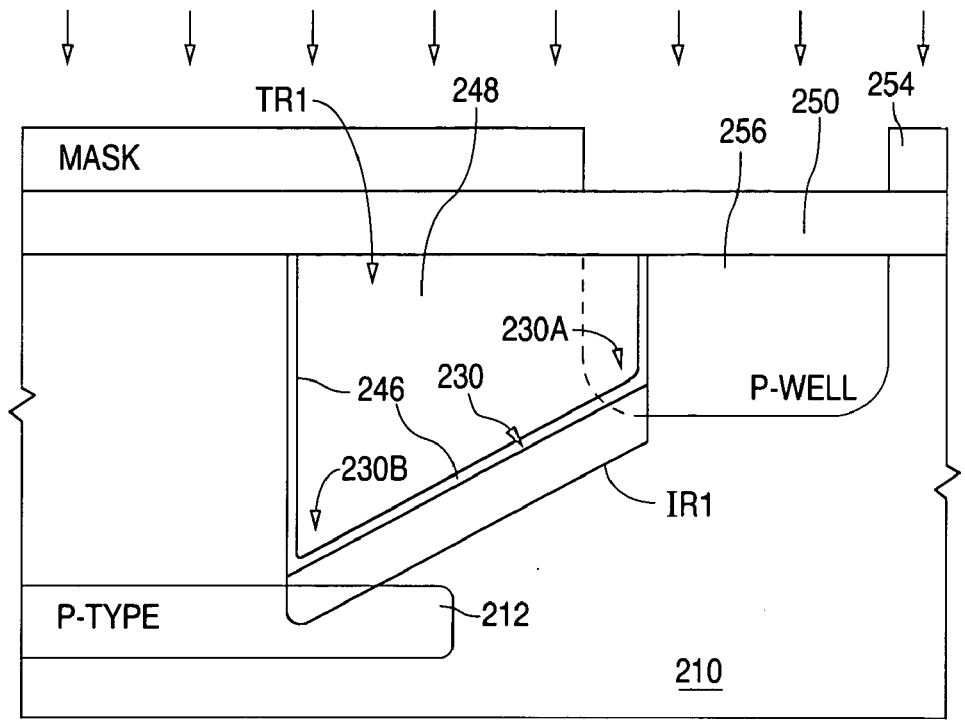

Next, as shown in FIG. 2F, semiconductor material 210 is implanted with a p-type dopant to form a well 256. Well 256 can be formed at the same time that the p-wells are formed on other portions of the wafer. Following this, mask 254 and sacrificial layer 250 are then removed.

Figure 2G:
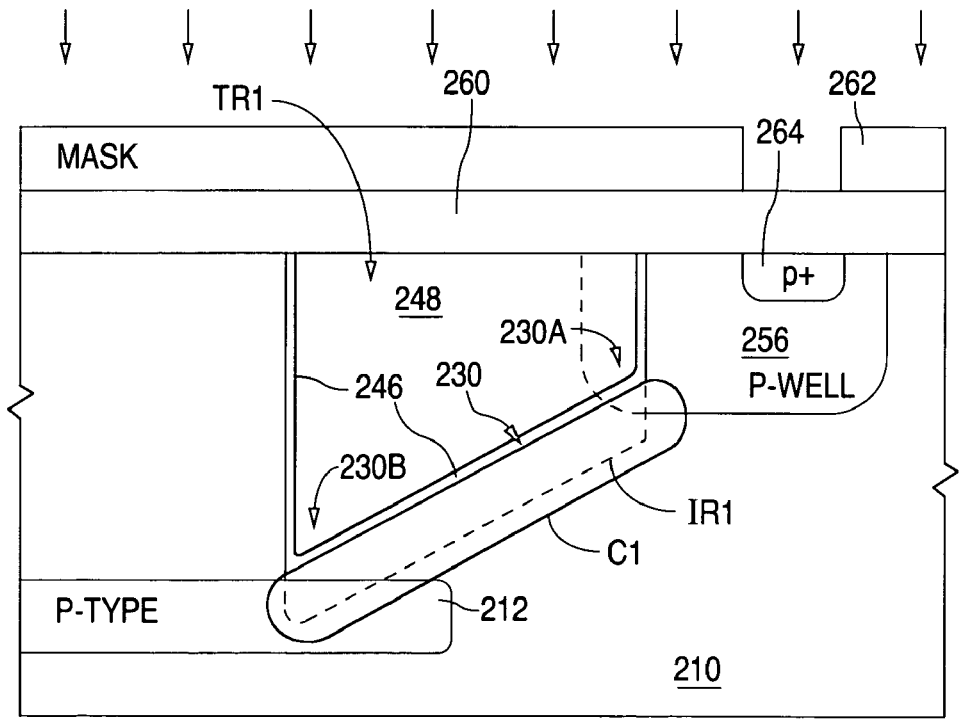

As shown in FIG. 2G, an insulating layer 260, such as oxide, is subsequently formed on semiconductor material 210 and the top surfaces of isolation material 246 and filler material 248 in trench TR1. Following this, a mask 262 is formed and patterned on layer 260. (A number of intermediate steps typically take place on other portions of the wafer to form MOS and/or bipolar transistors prior to the formation of mask 262. Mask 262 is used to protect n-type regions, and expose p-type contact regions, of the wafer.)

Next, semiconductor material 210 is implanted with a p-type dopant to form a p+ contact region 264 in well 256. Region 264 can be formed at the same time that the p+ regions are formed on other portions of the wafer. Following this, mask 262 is removed.

Following the implant, the wafer is annealed to drive in the dopants and repair lattice damage caused by the implants. The annealing process causes the dopant in implanted region IR1 below the bottom surface of trench TR1 to diffuse out to the surrounding semiconductor material to form a conductor C1. (Prior thermal steps also aid in this process.) Thus, as shown in FIG. 2G, conductor C1 electrically connects first conductive region 212 with p-well 256. After the wafer has been annealed, the method continues with conventional back end processing steps.

Figure 3A:
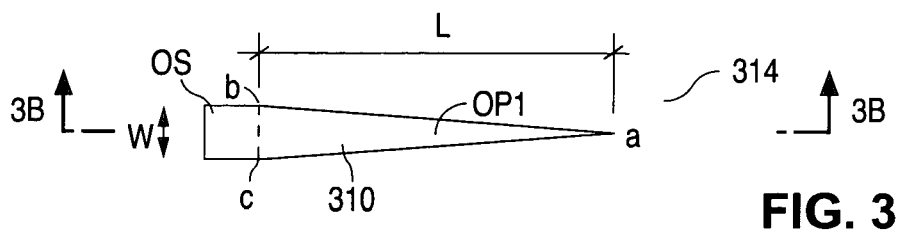
FIGS. 3A–3G are a series of cross-sectional views illustrating an example of a method of forming a conductive structure in accordance with the present invention.
Figure 3B:
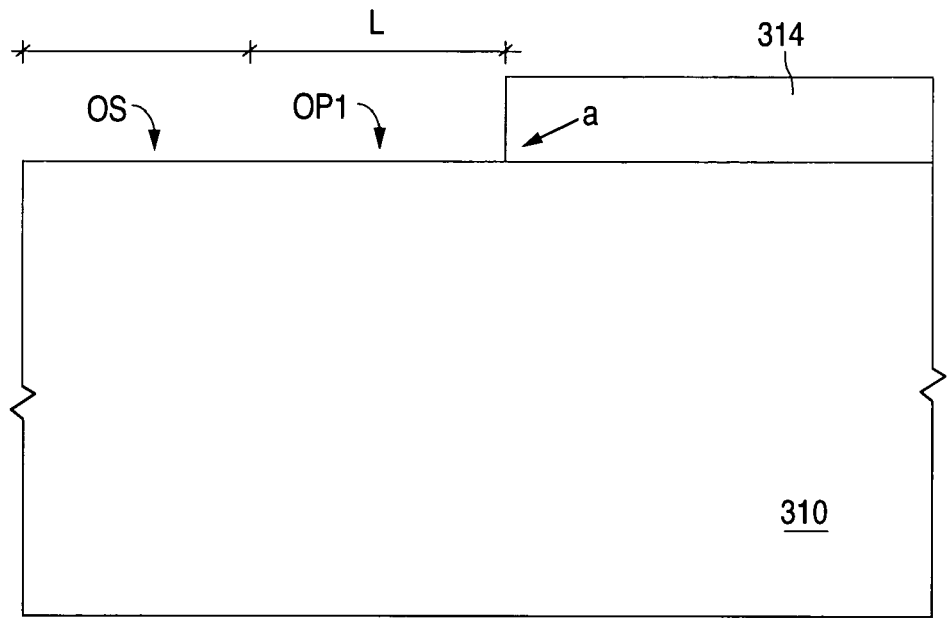

FIGS. 3A–3G show a series of views that illustrate an example of a method of forming a conductive structure in accordance with the present invention. FIG. 3A is a plan view, while FIGS. 3B–3G are cross-sectional views taken along line 3B—3B of FIG. 3A. As shown in FIGS. 3A and 3B, the method uses a conventionally formed semiconductor material 310, such as a substrate, an epitaxial layer, or an epitaxial layer formed on a substrate.

As further shown in FIGS. 3A and 3B, the method begins by forming a mask 314 on semiconductor material 310. The mask is patterned to have an opening OP1 that is shaped like a triangle in plan view, and an opening OS that adjoins opening OP1. Opening OP1 is formed with three points, 'a,' 'b,' and 'c.'

Mask opening OP1 is also formed to have a width W between points 'b' and 'c', and a width of zero at point 'a'. Opening OP1 also has a length L that is defined by the distance between segment 'b–c' and point 'a'. (Alternatively, the opening can be formed as a trapezoid having two first points and two second points laterally spaced apart from the first two points).

Figure 3C:
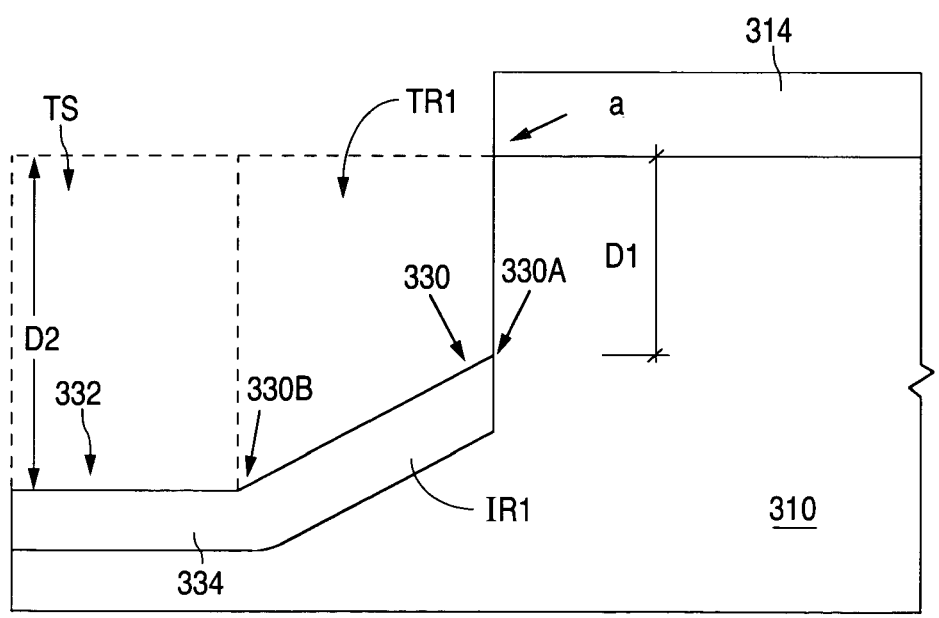

Next, as shown in FIG. 3C, semiconductor material 310 is anisotropically etched to remove the material not protected by mask 314, thereby forming a wedge shaped trench TR1 and an adjoining trench TS. Since the width of trench TR1 varies, the trench depth also varies due to aspect ratio dependent etching. In this case, the depth of the trench is determined by the width of the mask opening; a wider opening yielding a deeper trench.

In the FIG. 3C example, trench TR1 is formed to have two substantially vertical sidewalls, an open end adjoining trench TS, and a sloped bottom surface 330. (Alternately, if a trapezoidal mask opening is used, the trench will have three sidewalls). Bottom surface 330 has a depth D1 at a shallow end 330A of trench TR1, and a depth D2, which is greater than D1, at a deep end 330B of the trench adjacent to the bottom of the trench TS. (Although trench TR1 is shown to have a depth D2, the trench can alternately be formed with increased width and depth to extend deeper into the semiconductor material to connect with a deeper subsurface conductive region.) Trench TS, in turn, is formed to have two or more substantially vertical sidewalls, an open end adjoining trench TR1, and a flat bottom surface 332.

As further shown in FIG. 3C, after trenches TR1 and TS have been formed, the bottom surfaces 330 and 332 of trenches TR1 and TS are then implanted with a p-type dopant, such as boron, to form an implanted region IR1 that lies below the bottom surface 330 of trench TR1 and an implanted region 334 that lies below the bottom surface 332 of trench TS. Following this, mask 314 is removed.

Figure 3D:
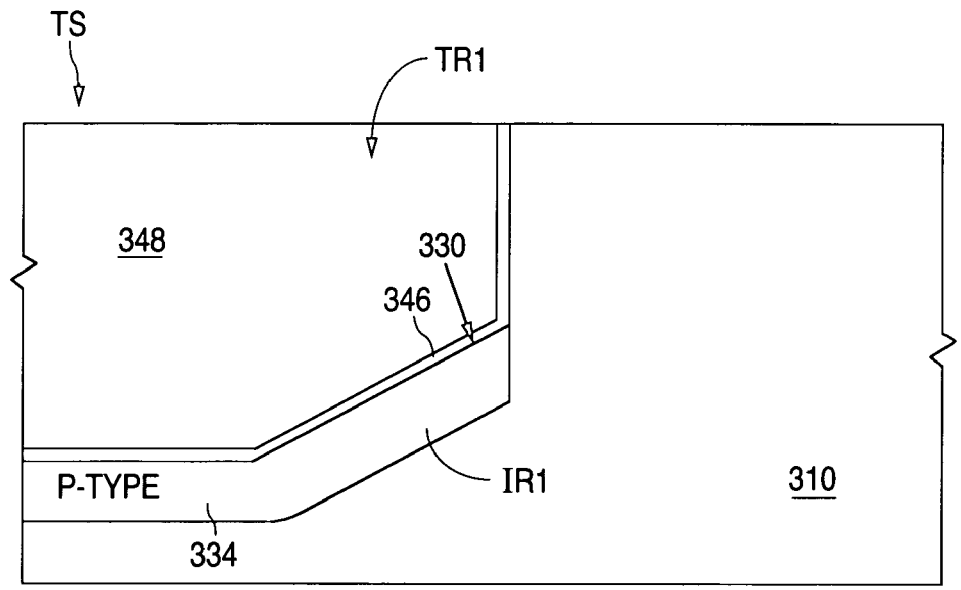

Turning to FIG. 3D, after mask 314 has been removed, a layer of isolation material 346, such as thermally grown oxide, is formed on semiconductor material 310, trench TR1 to line trench TR1, and trench TS to line trench TS. After the trenches TR1 and TS have been lined, a layer of filler material 348, such as oxide or polysilicon, is formed on material 346 to fill trenches TR1 and TS. Once filled, materials 346 and 348 are planarized to remove filler material 348 and isolation material 346 from the top surface of semiconductor material 310.

Figure 3E:
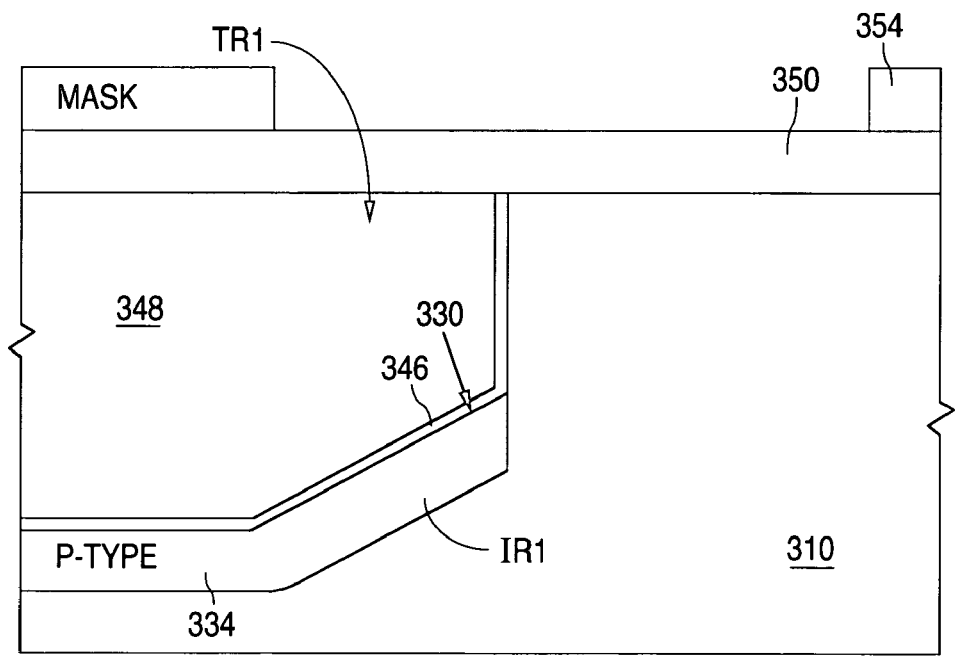

After this step, as shown in FIG. 3E, an insulating layer 350, such as sacrificial oxide, is formed on semiconductor material 310 and the top surfaces of isolation material 346 and filler material 348 in trenches TR1 and TS. Following this, a mask 354 is formed and patterned on layer 350.

Figure 3F:
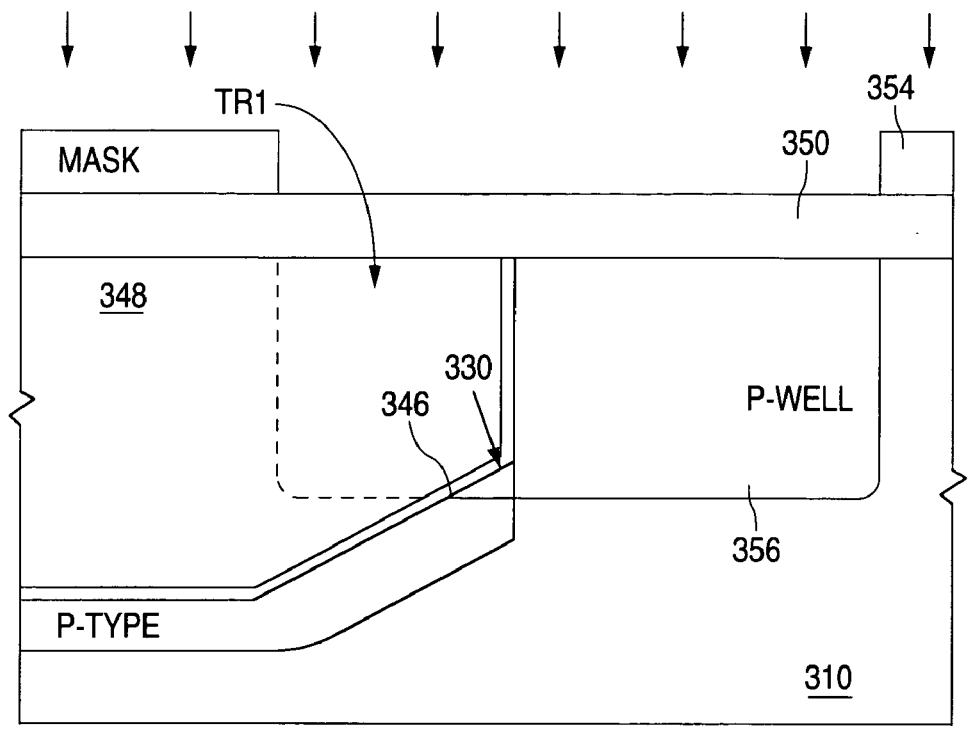

Next, as shown in FIG. 3F, semiconductor material 310 is implanted with a p-type dopant to form a well 356. Well 356 can be formed at the same time that the p-wells are formed on other portions of the wafer. Following this, mask 354 and sacrificial layer 350 are then removed.

Figure 3G:
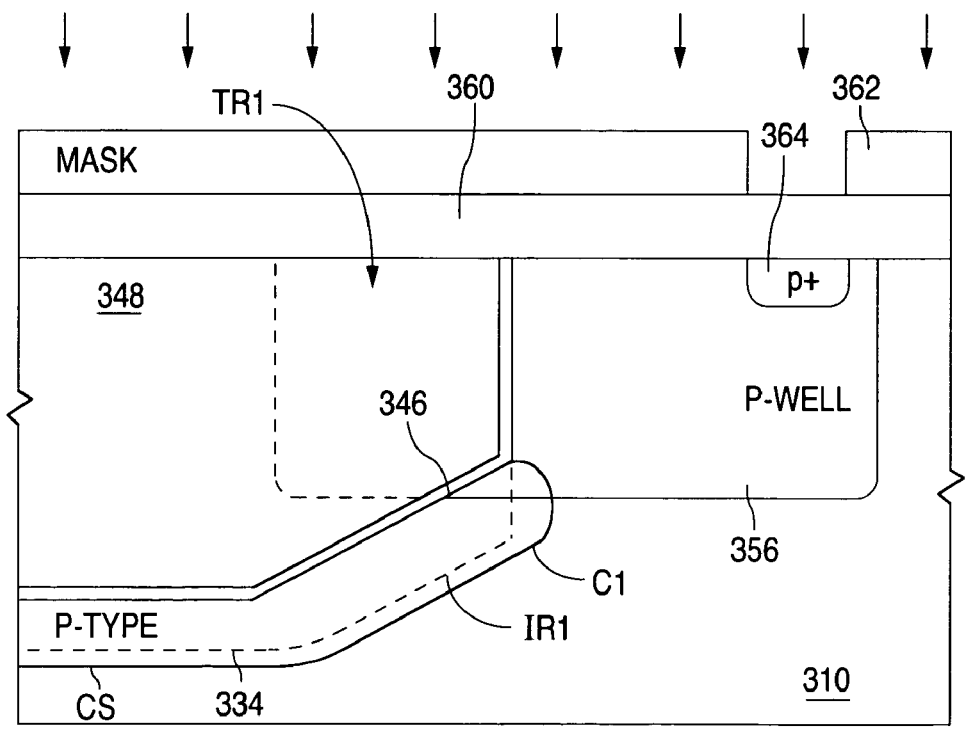

As shown in FIG. 3G, an insulating layer 360, such as oxide, is subsequently formed on semiconductor material 310 and the top surfaces of isolation material 346 and filler material 348 in trenches TR1 and TS. Following this, a mask 362 is formed and patterned on layer 360. (A number of intermediate steps typically take place on other portions of the wafer to form MOS and/or bipolar transistors prior to the formation of mask 362. Mask 362 is used to protect n-type regions, and expose p-type contact regions, of the wafer.)

Next, semiconductor material 310 is implanted with a p-type dopant to form a p+ contact region 364 in well 356. Region 364 can be formed at the same time that the p+ regions are formed on other portions of the wafer. Following this, mask 362 is removed.

Following the implant, the wafer is annealed to drive in the dopants and repair lattice damage caused by the implants. The annealing process causes the dopant in implanted region IR1 below the bottom surface of trench TR1 to diffuse out to the surrounding semiconductor material to form a conductor C1.

The annealing process also causes the dopant in implanted region 334 below the bottom surfaces of trench TS to diffuse out to the surrounding semiconductor material to form a conductive region CS, such as a channel stop region. (Prior thermal steps also aid in this process.) Thus, as shown in FIG. 3G, conductor C1 electrically connects conductive region CS with p-well 356. After the wafer has been annealed, the method continues with conventional back end processing steps.

Figure 4A:
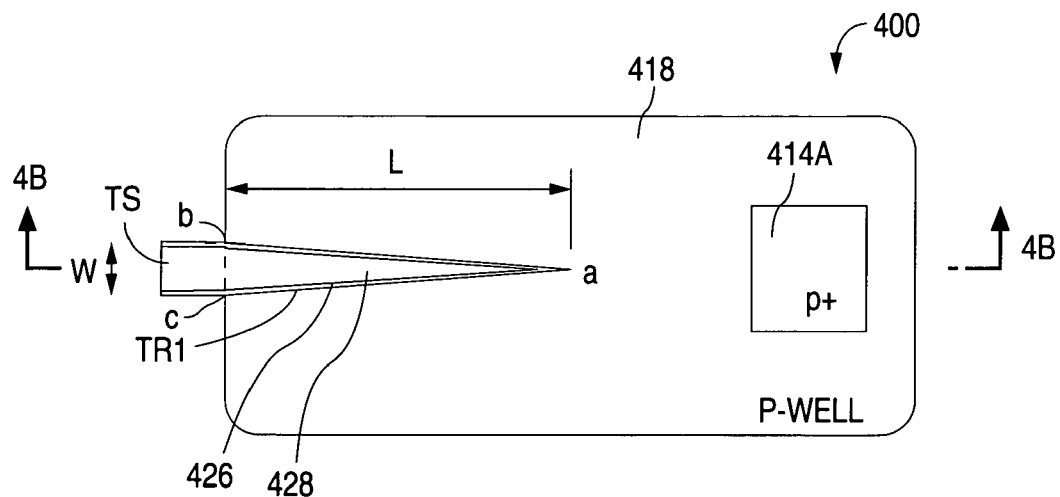
FIGS. 4A–4B are views illustrating an example of a conductive structure 400 in accordance with the present invention.
Figure 4B:
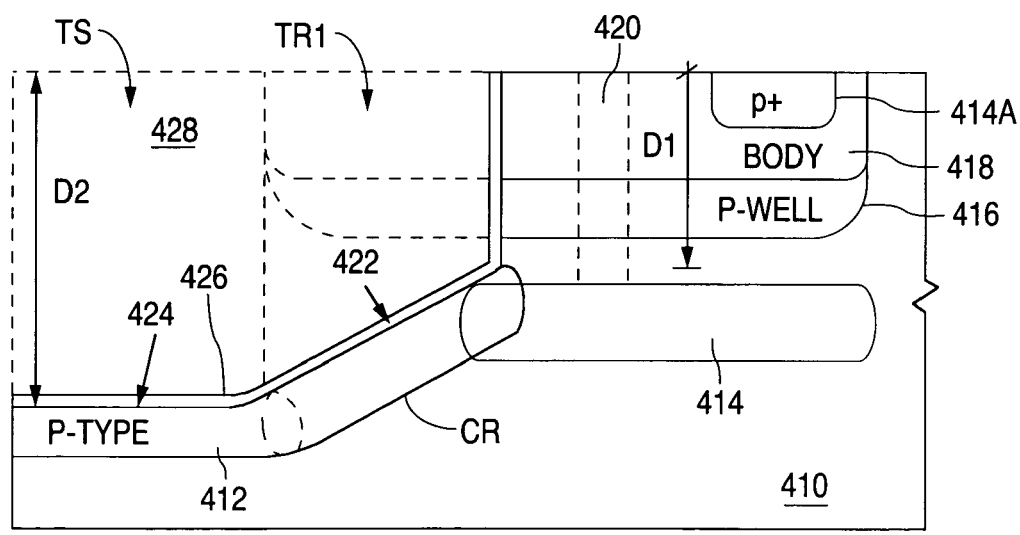

FIGS. 4A–4B show views that illustrate an example of a conductive structure 400 in accordance with the present invention. FIG. 4A is a plan view, and FIG. 4B is a cross-sectional view taken along line 4B—4B of FIG. 4A. Conductive structure 400, which is formed in a semiconductor material 410, includes first and second p-type conductive regions 412 and 414, respectively, that are formed in material 410. Examples of semiconductor material 410 include an n-type substrate, an n-type epitaxial layer, and an epitaxial layer on an n-type substrate.

In the example shown in FIGS. 4A–4B, conductive regions 412 and 414 are both formed as p-type subsurface regions in an n-type portion of semiconductor material 410. First conductive region 412 can be implemented as, for example, a channel stop region, while second conductive region 414 can be implemented as, for example, a buried region. Further, although conductive regions 412 and 414 are described as having p-type conductivities in an n-type material, the present invention applies when the conductivity types of the materials are reversed.

In addition, structure 400 includes a conductor CR that is formed in semiconductor material 410. Conductor CR, which can be implemented with a p-type dopant, electrically connects together first and second regions 412 and 414. Structure 400 additionally includes a contact region 414A that is formed in material 410. Regions 114 and 114A can have similar dopant concentrations. For example, regions 114 and 114A can both have p+ dopant concentrations. Structure 400 can optionally include a well 416 that is formed in semiconductor material 410 such that region 414A is formed in well 416.

Further, structure 400 can optionally include a p-body region 418 that is formed in well 416. P-body region 418 has a slightly higher dopant concentration than p well 416. Further, p-body region 418 is approximately the same size and shape in plan view as well 416.

Second conductive region 414 and well 416 are spaced apart. However, structure 400 can further optionally include a sinker region 420 that extends upwards from region 414 to well 416, body 418, region 414A, or the top surface of material 410. Sinker region 420 provides a lower resistance path.

As further shown in FIGS. 4A–4B, structure 400 also includes a wedge shaped trench TR1 and an adjoining trench TS that are formed in semiconductor material 410 such that a bottom surface 422 of trench TR1 and a bottom surface 424 of trench TS are formed over conductor CR and first conductive region 412, respectively. The top of trench TR1 is defined by points 'a', 'b', and 'c' on the top surface of semiconductor material 410.

The width and depth of trench TR1 increases as the trench moves away from region 414. Bottom surface 422 slopes down from a first depth D1 in region 414, to a second, overall depth D2. Additionally, bottom surface 422 increases in width, from zero below point 'a', to a width W below segment 'b–c'. (Although trench TR1 is shown in the example to have a triangular shape in plan view, the trench can alternately be formed as a trapezoid in plan view by substituting a line segment having a width less than W for point 'a'.)

Trench TR1 is formed using a process of aspect ratio dependent etching, so that the depth of the trench increases as the width of the trench increases. Alternately, a wider and deeper trench, or a narrower and shallower trench can be utilized to approach regions located at other depths.

As further shown in FIGS. 4A and 4B, conductive structure 400 also includes a layer of isolation material 426 that lines trenches TR1 and TS, and a region of filler material 428 that is formed on isolation material 426 to fill trench TR1. Isolation layer 426 can be implemented with, for example, an oxide, while filler region 428 can be implemented with, for example, polysilicon or oxide.

In operation, when a first potential is present on conductive region 412 and a higher second potential is present on contact region 414A, a current flows from region 414A to region 414 via material 410, material 410 and well 416, material 410, well 416, and body 418, sinker 420, or sinker 420 in combination with any of the above. From region 414, the current flow through conductor CR to region 412.

Figure 5A:
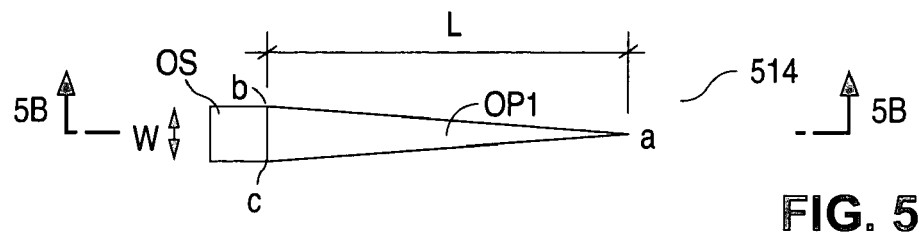
FIGS. 5A–5G are cross-sectional views illustrating an example of a method of forming a conductive structure in accordance with the present invention.
Figure 5B:
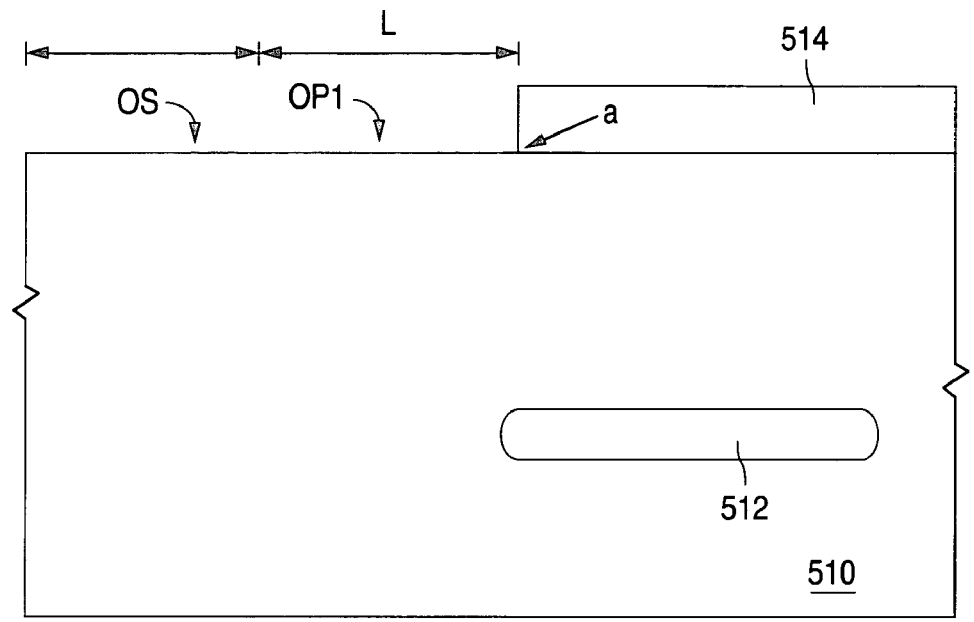

FIGS. 5A–5G show cross-sectional views that illustrate an example of a method of forming a conductive structure in accordance with the present invention. As shown in FIGS. 5A–5B, the method uses a conventionally formed semiconductor material 510, such as an epitaxial layer on an n-type substrate, that has a p-type subsurface conductive region 512, such as a buried layer, formed in material 510 between the epitaxial layer and the n-type substrate.

As further shown in FIGS. 5A–5B, the method begins by forming a mask 514 on semiconductor material 510. The mask is patterned to have an opening OP1 that is shaped like a triangle in plan view, and an opening OS that adjoins opening OP1. Opening OP1 is formed with three points, 'a,' 'b,' and 'c.'

Mask opening OP1 is also formed to have a width W between points 'b' and 'c', and a width of zero at point 'a'. Opening OP1 also has a length L that is defined by the distance between segment 'b–c' and point 'a'. (Alternatively, the opening can be formed as a trapezoid having two first points and two second points laterally spaced apart from the first two points).

Figure 5C:
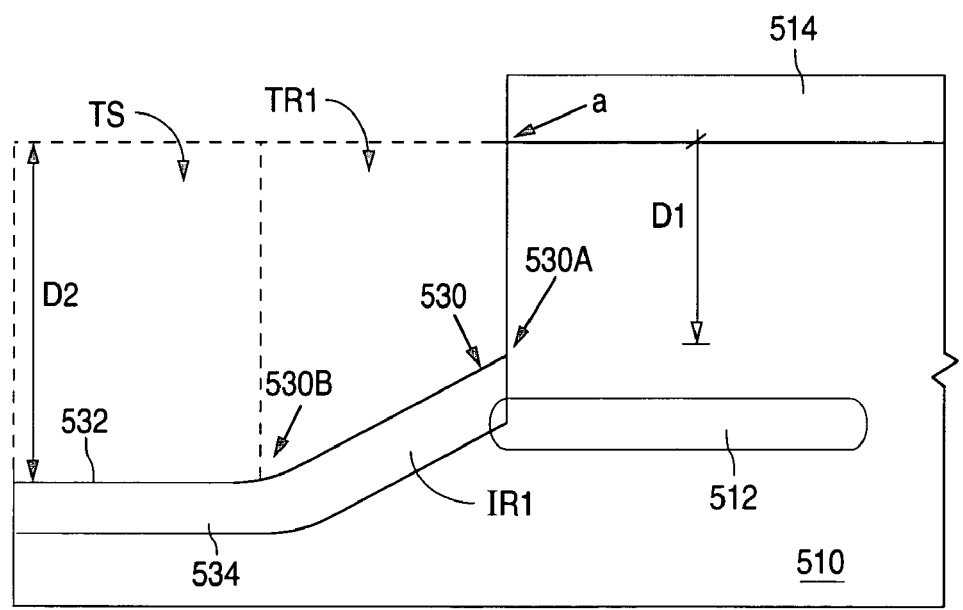

Next, as shown in FIG. 5C, semiconductor material 510 is anisotropically etched to remove the material not protected by mask 514, thereby forming a wedge shaped trench TR1 and an adjoining trench TS. Since the width of trench TR1 varies, the trench depth also varies due to aspect ratio dependent etching. In this case, the depth of the trench is determined by the width of the mask opening; a wider opening yielding a deeper trench.

In the FIG. 5C example, trench TR1 is formed to have two substantially vertical sidewalls, an open end adjoining trench TS, and a sloped bottom surface 530. (Alternately, if a trapezoidal mask opening is used, the trench will have three sidewalls). Bottom surface 530 has a depth D1 at a shallow end 530A of trench TR1, and a depth D2, which is greater than D1, at a deep end 530B of the trench, adjacent to the bottom of the trench TS. (Although trench TR1 is shown to have a depth D2, the trench can alternately be formed with increased width and depth to extend deeper into the semiconductor material to connect with a deeper subsurface conductive region.) Trench TS, in turn, is formed to have two substantially vertical sidewalls, an open end adjoining trench TR1, and a flat bottom surface 532.

As further shown in FIG. 5C, after trenches TR1 and TS have been formed, the bottom surfaces 530 and 532 of trenches TR1 and TS are then implanted with a p-type dopant, such as boron, to form an implanted region IR1 that lies below the bottom surface 530 of trench TR1 and an implanted region 534 that lies below the bottom surface 532 of trench TS. Following this, mask 514 is removed.

Figure 5D:
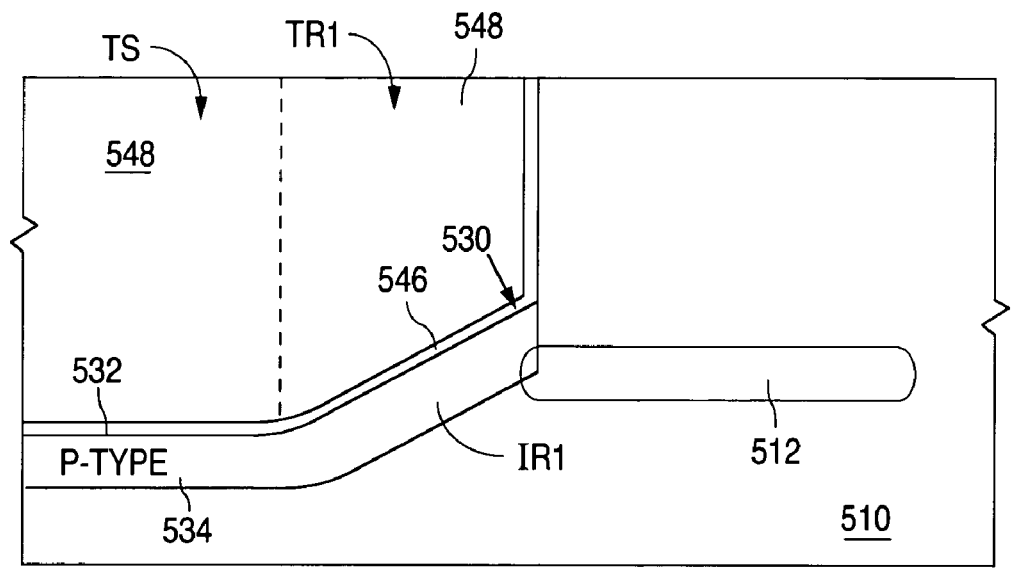

Turning to FIG. 5D, after mask 514 has been removed, a layer of isolation material 546, such as thermally grown oxide, is formed on semiconductor material 510, trench TR1 to line trench TR1, and trench TS to line trench TS. After the trenches TR1 and TS have been lined, a layer of filler material 548, such as oxide or polysilicon, is formed on material 546 to fill trenches TR1 and TS. Once filled, materials 546 and 548 are planarized to remove filler material 548 and isolation material 546 from the top surface of semiconductor material 510.

Figure 5E:
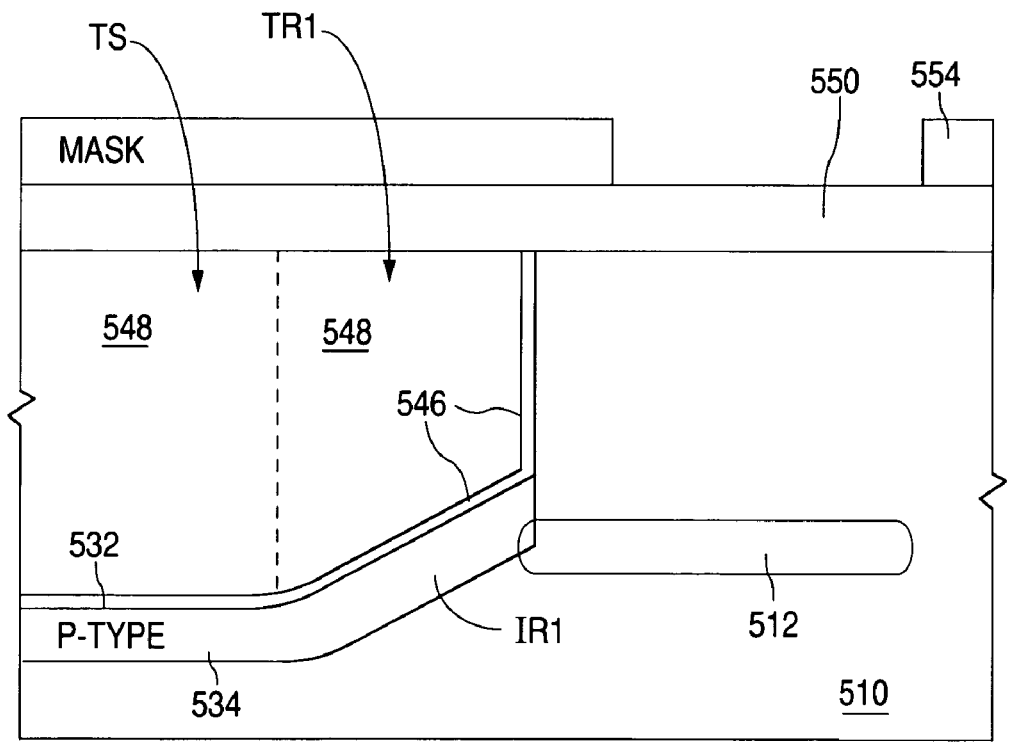

After this step, as shown in FIG. 5E, an insulating layer 550, such as sacrificial oxide, is formed on semiconductor material 510 and the top surfaces of the isolation material 546 and filler material 548 in trenches TR1 and TS. Following this, a mask 554 is formed and patterned on layer 550.

Figure 5F:
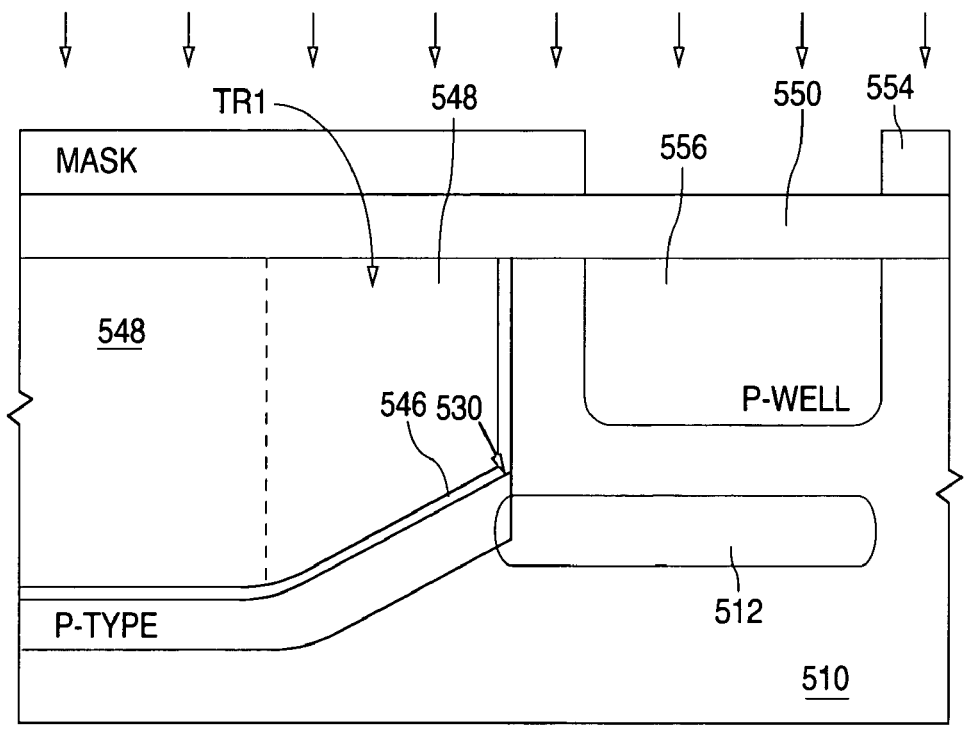

Next, as shown in FIG. 5F, semiconductor material 510 is implanted with a p-type dopant to form a well 556. Well 556 can be formed at the same time that the p-wells are formed on other portions of the wafer. Following this, mask 554 and sacrificial layer 550 are then removed.

Figure 5G:
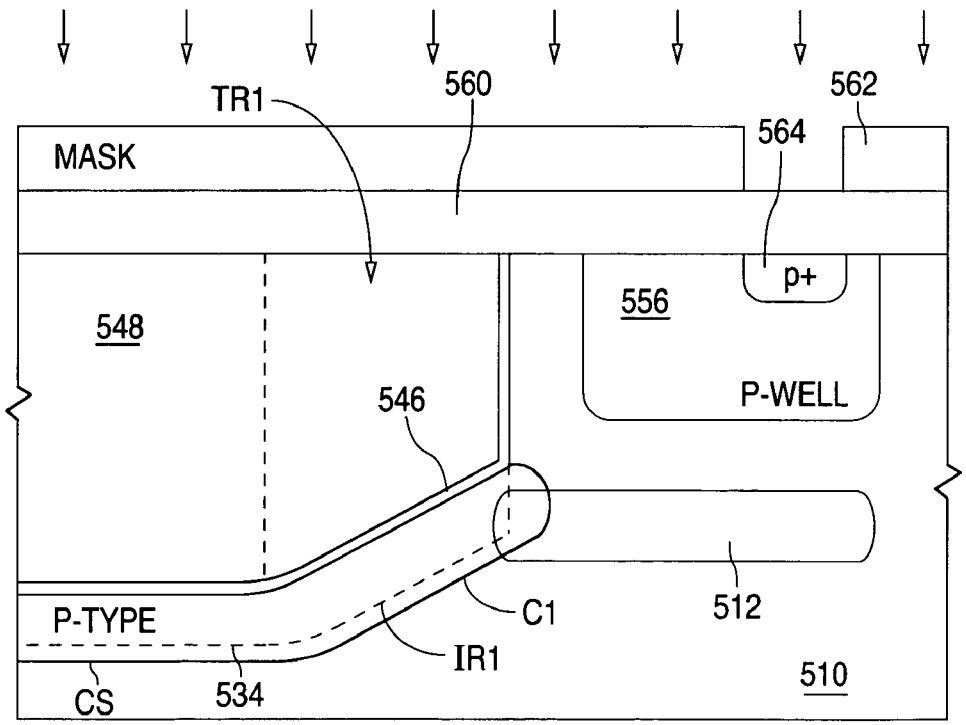

As shown in FIG. 5G, an insulating layer 560, such as oxide, is subsequently formed on semiconductor material 510 and the top surfaces of isolation material 546 and filler material 548 in trenches TR1 and TS. Following this, a mask 562 is formed and patterned on layer 560. (A number of intermediate steps typically take place on other portions of the wafer to form MOS and/or bipolar transistors prior to the formation of mask 562. Mask 562 is used to protect n-type regions, and expose p-type contact regions, of the wafer.)

Next, semiconductor material 510 is implanted with a p-type dopant to form a p+ contact region 564 in well 556. Region 564 can be formed at the same time that the p+ regions are formed on other portions of the wafer. Following this, mask 562 is removed.

Following the implant, the wafer is annealed to drive in the dopants and repair lattice damage caused by the implants. The annealing process causes the dopant in implanted region IR1 below the bottom surfaces of trench TR1 to diffuse out to the surrounding semiconductor material to form a conductor C1.

The annealing process also causes the dopant in implanted region 534 below the bottom surfaces of trench TS to diffuse out to the surrounding semiconductor material to form a conductive region CS, such as a channel stop region. (Prior thermal steps also aid in this process.) Thus, as shown in FIG. 5G, conductor C1 electrically connects conductive region CS with p-well 556. After the wafer has been annealed, the method continues with conventional back end processing steps.

Figure 6A:
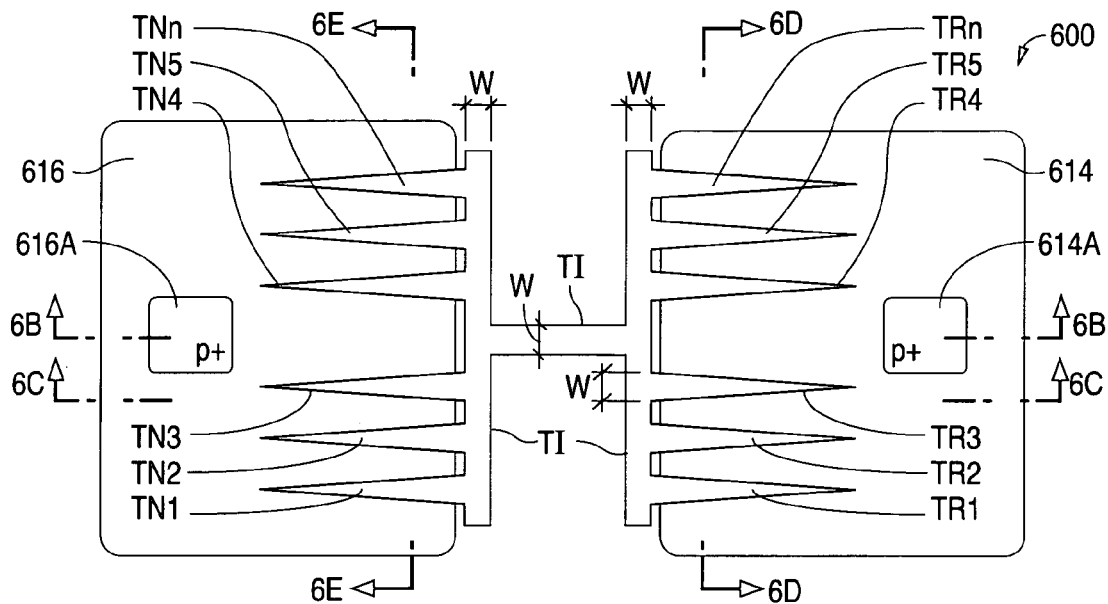
FIGS. 6A–6E are a series of views illustrating an example of a conductive structure 600 in accordance with the present invention.
Figure 6B:
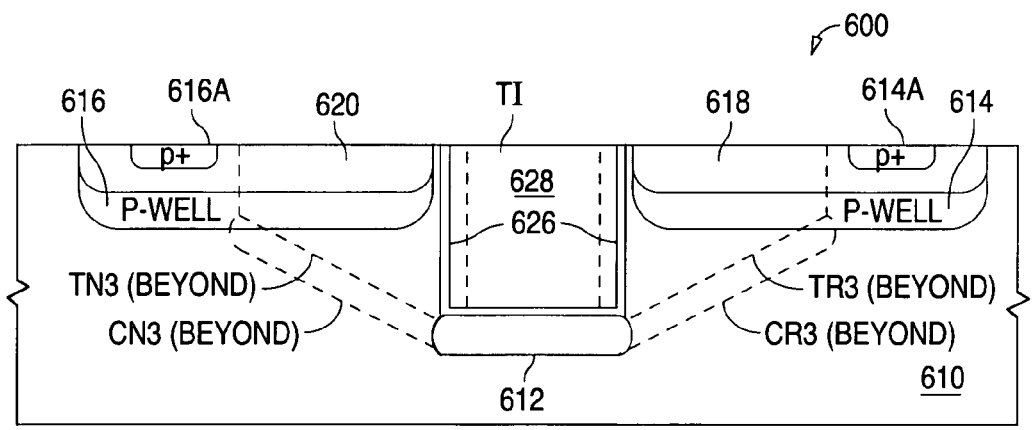
Figure 6C:
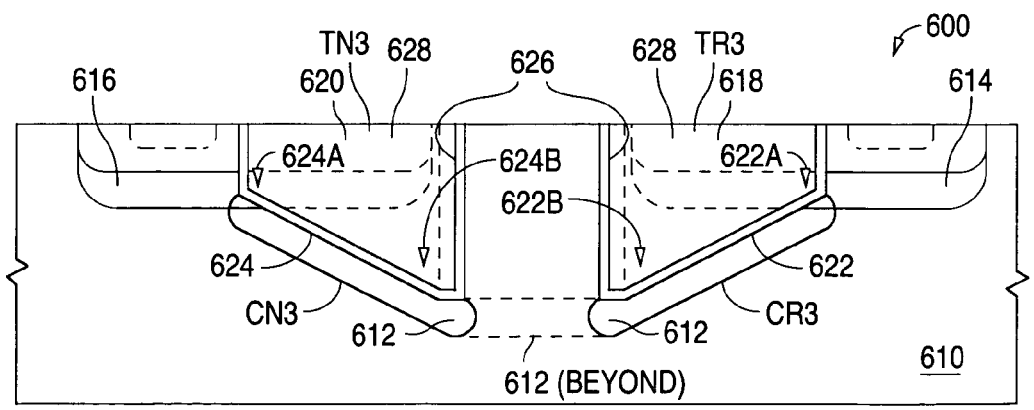

FIGS. 6A–6E show a series of views that illustrate an example of a conductive structure 600 in accordance with the present invention. FIG. 6A is a plan view, while FIGS. 6B–6E are cross-sectional views taken along lines 6B—6B, 6C—6C, 6D—6D, and 6E—6E, respectively, of FIG. 6A. As shown in FIGS. 6A–6C, conductive structure 600, which is formed in a semiconductor material 610, such as an epitaxial layer on an n-type substrate, includes first, second, and third p-type conductive regions 612, 614, and 616, respectively, that are formed in material 610. Conductive region 612 is vertically spaced apart from conductive regions 614 and 616.

In the FIG. 6 example, first conductive region 612 is formed as an "H" shaped, p-type subsurface region in an n-type portion of semiconductor material 610, while second and third conductive regions 614 and 616 are formed as p-type wells that contact the top surface of semiconductor material 610. First conductive region 612 can be implemented as, for example, a channel stop region.

As further shown in FIGS. 6A–6E, structure 600 can also include a contact region 614A that is formed in second conductive region 614, and a contact region 616A that is formed in second conductive region 616. Contact region 614A has a higher dopant concentration than region 614, and contact region 616A has a higher dopant concentration than region 616. For example, regions 614 and 616 can have p dopant concentrations, while contact regions 614A and 616A can have p+ dopant concentrations.

In addition, structure 600 can optionally include a p-body region 618 that is formed in well 614, and a p-body region 620 that is formed in well 616. Regions 618 and 620 have a slightly higher dopant concentrations than wells 614 and 616, respectively. Further, p-body regions 618 and 620 are approximately the same size and shape in plan view as wells 614 and 616, respectively.

As further shown in FIG. 6, structure 600 also includes an "H" shaped isolation trench TI, a series of spaced apart, first wedge shaped trenches TR1–TRn, and a series of spaced apart, second wedge shaped trenches TN1–TNn that are formed in semiconductor material 610. The isolation trench TI is formed over and contacts first conductive region 612. The vertical sections of the "H" shape contact the open ends of the deepest portions of the trenches TR1–TRn and TN1–TNn.

The series of spaced apart trenches TR1–TRn are formed such that the bottom surfaces of trenches TR1–TRn lie between first and second conductive regions 612 and 614. In the example shown, six trenches are utilized. Each of trenches TR1–TRn has a bottom surface 622 that slopes down from a shallow end 622A of the trench in region 614, to a deep end 622B of the trench, so that the widths and depths of trenches TR1–TRn increase as the trenches move from region 614 to region 612.

The series of spaced apart trenches TN1–TNn are formed in semiconductor material 610 such that the bottom surfaces of trenches TN1–TNn lie between first and third conductive regions 612 and 616. In the example shown, six trenches are utilized. Each of trenches TN1–TNn has a bottom surface 624 that slopes down from a shallow end 624A of the trench in region 616, to a deep end 624B of the trench, so that the widths and depths of trenches TN1–TNn increase as the trenches move from region 616 to region 612. Further, the trenches TI, TR1–TRn, and TN1–TNn are lined with an isolation material 626, such as an oxide, and are filled with a filler material 628, such as polysilicon or oxide.

Conductive structure 600 further includes a series of first conductors CR1–CRn. Each conductor CR1–CRn is formed in semiconductor material 610 below a trench TR1–TRn. In addition, each conductor CR1–CRn contacts and is electrically connected to conductive regions 612 and 614.

Conductive structure 600 further includes a series of second conductors CN1–CNn. Each conductor CN1–CNn is formed in semiconductor material 610 below a trench TN1–TNn. In addition, each conductor CN1–CNn contacts and is electrically connected to conductive regions 612 and 616.

In operation, when a first potential is present on conductive region 616 and a higher second potential is present on conductive region 614, a current flows from region 614 to region 612 via conductors CR1–CRn, and from region 612 to region 616 via conductors CN1–CNn. Conductive structure 600 can be used, for example, as a buried resistor or a test structure for measuring the performance of the channel stop implant.

When used as a test structure, the trenches, including the "H" shaped trench TI, are formed at the same time that the trenches are formed for the trench isolation regions. In addition, the "H" shaped conductive region 612 is formed at the same time that the channel stop implants are formed for the trench isolation regions.

Thus, the horizontal portion of conductive region 612 (which lies below the horizontal bar of the "H" shaped trench TI) can serve as a representative sample of the channel stop implants used with the trench isolation regions, and can be tested to monitor the effective doping of the channel stop implants.

As a result, when a positive voltage is applied to conductive region 614 (via contact region 614A), and conductive region 616 is connected to ground via contact region 616A, current flows through structure 600, allowing measurement of the resistivity of the horizontal portion of conductive region 612. The resistivity measurement provides data on the quality of the channel stop implants without having to physically break and stain the wafer to observe the channel stop implanted regions.

Although the example shown in FIGS. 6A–6C includes a total of twelve wedge shaped trenches, the number of trenches, and the depth of the trenches can be varied to satisfy the requirements of the device design. Similarly, though structure 600 is shown to be symmetrical, the invention can also utilize a non-symmetrical configuration.

FIGS. 7A–7F2 show views that illustrate an example of a method of forming a conductive structure in accordance with the present invention. FIG. 7A shows a plan view, while FIGS. 7B1–7F1 and 7B2–7F2 are cross-sectional views taken along lines 7B1–7B1 and 7B2–7B2, respectively, of FIG. 7A.

As shown in FIGS. 7A, 7B1, and 7B2, the method, which uses n-type semiconductor material 710, begins by forming a mask 712 on material 710. Mask 712 is patterned to have an "H" shaped opening 714, a series of spaced apart first openings OP1–OPn that adjoin a first vertical leg of the "H", and a series of spaced apart second openings PN1–PNn that adjoin a second vertical leg of the "H".

In the present example, six first openings and six second openings are utilized, each shaped like a triangle having two points adjoining opening 714 and a third point spaced apart from opening 714. (Alternatively, openings OP1–OPn and PN1–PNn can be formed as trapezoids, each having two points adjoining opening 714 and two points laterally spaced apart from opening 714). Each of the openings OP1–OPn and PN1–PNn, in turn, expose a region of the surface of material 710.

Mask openings OP1–OPn and PN1–PNn are formed to have a width W between the points of the openings in contact with the "H" shaped opening 714. Similarly, each of the vertical legs and the horizontal center bar of opening 714 have a width W. Mask 712 is part of the same mask that is used to form the trenches of the trench isolation regions that are formed on other portions of the wafer.

Next, as shown in FIGS. 7C1 and 7C2, semiconductor material 710 is anisotropically etched to remove the material not protected by mask 712. The etch forms an "H" shaped trench 716, a series of spaced apart, wedge shaped first trenches TR1–TRn that adjoin a first vertical leg of the "H", and a series of spaced apart, wedge shaped second trenches TN1–TNn that adjoin a second vertical leg of the "H" (Only trenches TR3 and TN3 are illustrated.) By using a process of aspect ratio dependent etching, the depth of each of the trenches is greatest where the trench is widest.

In the example of FIGS. 7C1–7C2, six wedge shaped first trenches and six wedge shaped second trenches are formed. (Although twelve trenches are utilized in the example, the number and configuration of trenches can be varied.) Each of the wedge shaped trenches TR1–TRn is formed to have two substantially vertical sidewalls, a sloped bottom surface 722, and an open end adjoining trench 716. (Alternately, if a trapezoidal mask opening is used, the trench will have three sidewalls).

In each of the wedge shaped trenches TR1–TRn, bottom surface 722 has a depth D1 at a shallow end 722A of the trench, and a depth D2, which is greater than D1, at a deep end 722B of the trench adjacent to trench 716. In the present example, the bottom surface 722 of each of the wedge shaped trenches TR1–TRn contacts the bottom surface of the "H" shaped trench 716.

Each of the wedge shaped trenches TN1–TNn is formed to have two substantially vertical sidewalls, a sloped bottom surface 724, and an open end adjoining trench 716. (Alternately, if a trapezoidal mask opening is used, the trench will have three sidewalls). In each of the wedge shaped trenches TN1–TNn, bottom surface 724 has a depth D1 at a shallow end 724A of the trench, and a depth D2, which is greater than D1, at a deep end 724B of the trench adjacent to trench 716. In the present example, the bottom surface 724 of each of the wedge shaped trenches TN1–TNn contacts the bottom surface of the "H" shaped trench 716.

As further shown in FIGS. 7C1–7C2, after trenches TR1–TRn, TN1–TNn, and 716 have been formed, the bottom surfaces 722 of trenches 716, TR1–TRn, and TN1–TNn are implanted with a p-type dopant, such as boron. The implant forms an "H" shaped implanted region 734 that lies below trench 716, a series of implanted regions IR1–IRn that lie below the bottom surfaces 722 of the trenches TR1–TRn, and a series of implanted regions IN1–INn that lie below the bottom surfaces 724 of trenches TN1–TNn. (Only implanted regions IR3 and IN3 are illustrated.) Each of the implanted regions IR1–IRn and each of the implanted regions IN1–INn contact implanted region 734.

Following this, mask 712 is removed. Trench 716, trenches TR1–TRn, and trenches TN1–TNn can be implanted at the same time that the channel stop is implanted below the trenches of the trench isolation regions that are formed on other portions of the wafer.

Turning to FIGS. 7D1–7D2, after mask 712 has been removed, a layer of isolation material 746, such as thermally grown oxide, is formed on semiconductor material 710, trench 716, trenches TR1–TRn, and trenches TN1–TNn to line the trenches. After trench 716, trenches TR1–TRn, and trenches TN1–TNn have been lined, a layer of filler material 748, such as oxide or polysilicon, is formed on material 746 to fill trench 716, trenches TR1–TRn, and trenches TN1–TNn. Once the trenches are filled, materials 746 and 748 are planarized to remove filler material 748 and isolation material 746 from the top surface of semiconductor material 710.

After this step, as shown in FIGS. 7E1–7E2, an insulating layer 749, such as sacrificial oxide, is formed on semiconductor material 710 and the top surfaces of isolation material 746 and filler material 748 in trench 716, trenches TR1–TRn, and trenches TN1–TNn. Following this, a mask 750 is formed and patterned on layer 749.

Semiconductor material 710 is then implanted with a p-type dopant to form a p-type well 756 so that the shallow ends of the bottom surfaces of trenches TR1–TRn lie in well 756. The implant also forms a p-type well 758 so that the shallow ends of the bottom surfaces of trenches TN1–TNn lie in well 758. Well 756 contacts (or nearly contacts) the upper portion of implanted regions IR1–IRn, and well 758 contacts (or nearly contacts) the upper portion of implanted regions IN1–INn. Wells 756 and 758 can be formed at the same time that the p-wells are formed on other portions of the wafer. Mask 750 and sacrificial layer 749 are then removed.

As shown in FIGS. 7F1–7F2, an insulating layer 764, such as oxide, is subsequently formed on semiconductor material 710 and the top surfaces of isolation material 746 and filler material 748 in trench 716, trenches TR1–TRn, and trenches TN1–TNn. Following this, a mask 766 is formed and patterned on layer 764. (A number of intermediate steps typically take place on other portions of the wafer to form MOS and/or bipolar transistors prior to the formation of mask 766. Mask 766 is used to protect n-type regions, and expose p-type contact regions, of the wafer.)

Following this, the wafer is implanted with a p-type dopant to form a p+ region 770 in well 756 and a p+ region 772 in well 758. Following the implant, the wafer is annealed to drive in the dopants and repair lattice damage caused by the implants. The annealing process causes the dopant in implanted regions 734, IR1–IRn, and IN1–INn to diffuse out to the surrounding semiconductor material to form conductive regions 774, CR1–CRn, and CN1–CNn, respectively. (Prior thermal steps also aid in this process.)

Figure 6D:
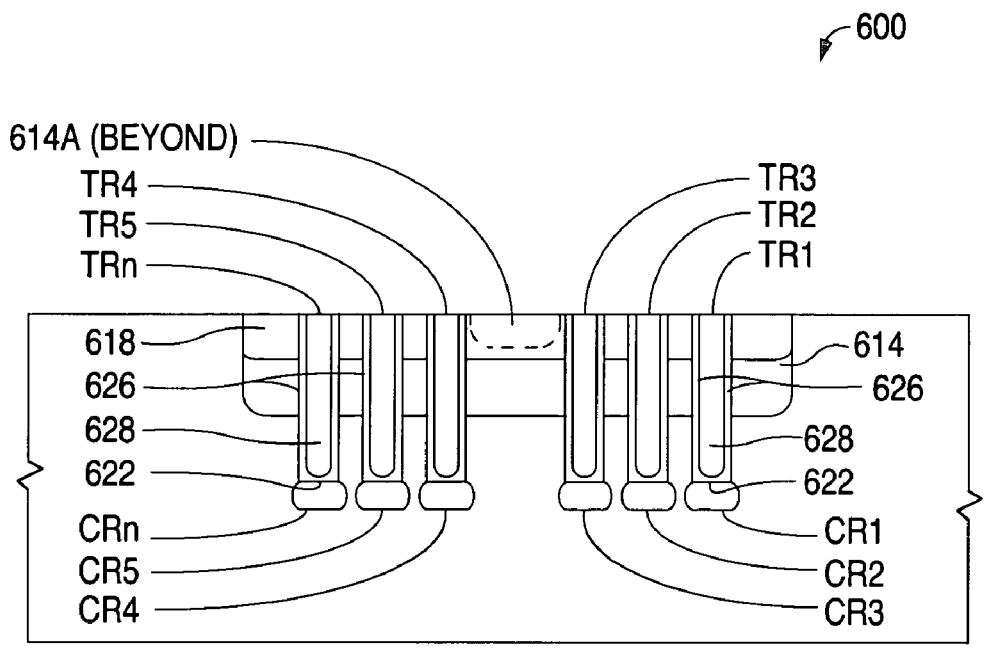
Figure 6E:
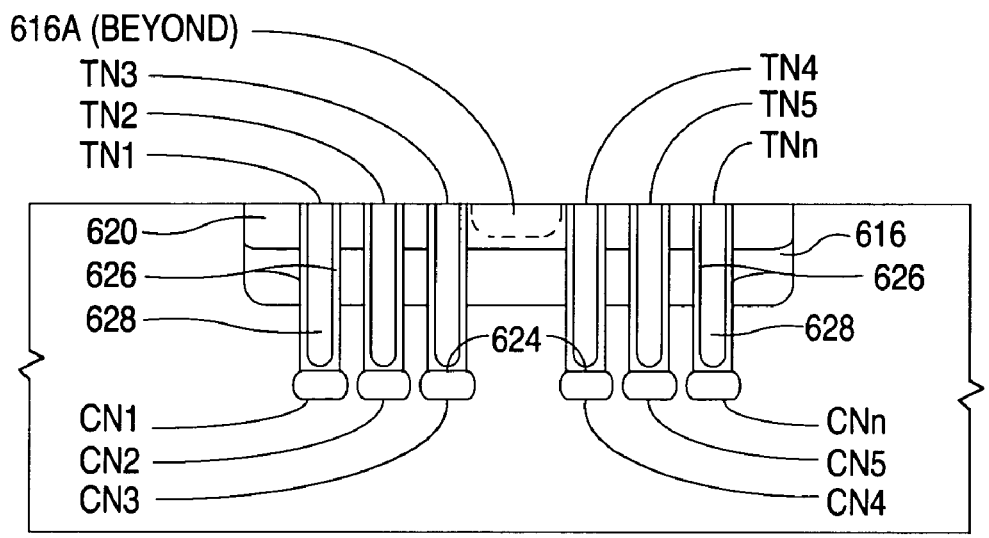

Conductive regions CR1–CRn connect conductive region 774 with p-well 756. Additionally, conductive regions CN1–CNn connect conductive region 774 with p-well 758. The connections form a continuous electrical connection from p-well 756 to p-well 758 via the "H" shaped conductive region 774. (The resulting structure in cross-section is shown in FIGS. 6D and 6E.) After the wafer has been annealed, the method continues with conventional back end processing steps.

Figure 8A:
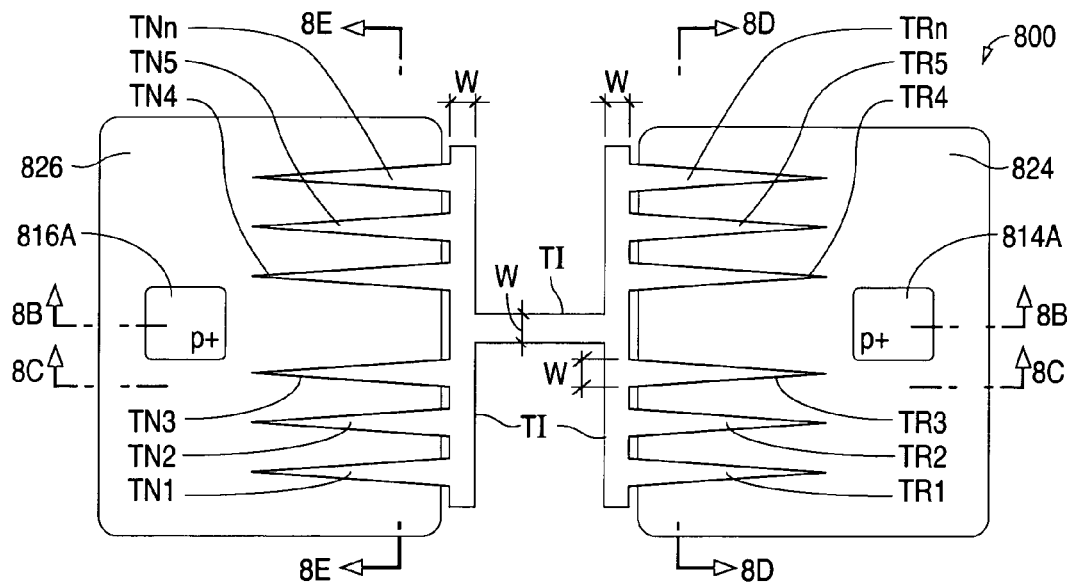
FIGS. 8A–8E are a series of views illustrating an example of a conductive structure 800 in accordance with the present invention.
Figure 8B:
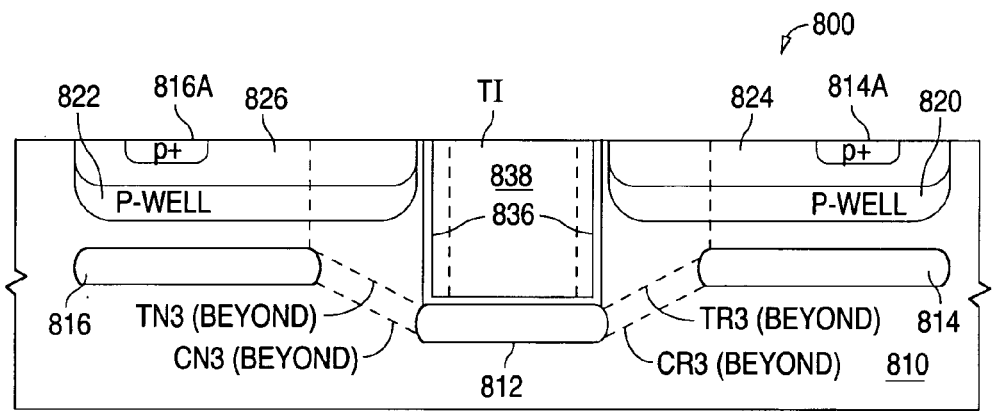
Figure 8C:
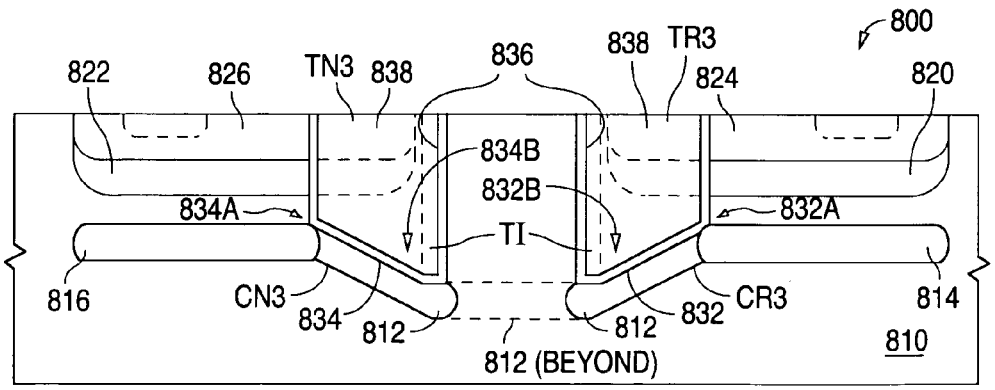

FIGS. 8A–8E show a series of views that illustrate an example of a conductive structure 800 in accordance with the present invention. FIG. 8A is a plan view, while FIGS. 8B–8E are cross-sectional views taken along lines 8B—8B, 8C—8C, 8D—8D, and 8E—8E, respectively, of FIG. 8A. As shown in FIGS. 8A–8E, conductive structure 800, which is formed in a semiconductor material 810, such as an epitaxial layer on an n-type substrate, includes first, second, and third p-type conductive regions 812, 814, and 816, respectively, that are formed in material 810. Conductive region 812 is vertically spaced apart from conductive regions 814 and 816.

In the FIG. 8 example, first conductive region 812 is formed as an "H" shaped, p-type subsurface region in an n-type portion of semiconductor material 810, while second and third conductive regions 814 and 816 are also formed as p-type subsurface regions in an n-type portion of material 810. First conductive region 812 can be implemented as, for example, a channel stop region, while regions 814 and 816 can be implemented as, for example, spaced apart buried regions.

As further shown in FIGS. 8A–8E, structure 800 also includes a contact region 814A that is formed in semiconductor material 810, and a contact region 816A that is formed in semiconductor material 810. Contact regions 814A and 816A can have similar dopant concentrations as conductive regions 814 and 816. For example, regions 814, 814A, 816, and 816A can have p+ dopant concentrations.

Structure 800 can optionally include a well 820 that is formed in semiconductor material 810 such that region 814A is formed in well 820, and a well 822 that is formed in semiconductor material 810 such that region 816A is formed in well 822. Second conductive region 814 and well 820 are vertically spaced apart, while third conductive region 816 and well 822 are vertically spaced apart.

In addition, structure 800 can optionally include a p-body region 824 that is formed in well 820, and a p-body region 826 that is formed in well 822. Regions 824 and 826 have slightly higher dopant concentrations than wells 820 and 822, respectively. Further, p-body regions 824 and 826 are approximately the same size and shape in plan view as wells 820 and 822, respectively.

As further shown in FIGS. 8A–8E, structure 800 also includes an "H" shaped isolation trench TI, a series of spaced apart, first wedge shaped trenches TR1–TRn, and a series of spaced apart, second wedge shaped trenches TN1–TNn that are formed in semiconductor material 810. The isolation trench TI is formed over and contacts first conductive region 812. The vertical sections of the "H" shape contact the open ends of the deepest portions of the trenches TR1–TRn and TN1–TNn.

The series of spaced apart trenches TR1–TRn are formed such that the bottom surfaces of trenches TR1–TRn lie between first and second conductive regions 812 and 814. In the example shown, six trenches are utilized. Each of trenches TR1–TRn has a bottom surface 832 that slopes down from a shallow end 832A of the trench in region 814, to a deep end 832B of the trench, so that the widths and depths of trenches TR1–TRn increase as the trenches move from region 814 to region 812.

The series of spaced apart trenches TN1–TNn are formed in semiconductor material 810 such that the bottom surfaces of trenches TN1–TNn lie between first and third conductive regions 812 and 816. In the example shown, six trenches are utilized. Each of trenches TN1–TNn has a bottom surface 834 that slopes down from a shallow end 834A of the trench in region 816, to a deep end 834B of the trench, so that the widths and depths of trenches TN1–TNn increase as the trenches move from region 816 to region 812. Further, the trenches TI, TR1–TRn, and TN1–TNn are lined with an isolation material 836, such as an oxide, and are filled with a filler material 838, such as polysilicon or oxide.

Conductive structure 800 further includes a series of first conductors CR1–CRn. Each conductor CR1–CRn is formed in semiconductor material 810 below a trench TR. In addition, each conductor CR1–CRn contacts and is electrically connected to conductive regions 812 and 814.

Conductive structure 800 further includes a series of second conductors CN1–CNn. Each conductor CN1–CNn is formed in semiconductor material 810 below a trench TN. In addition, each conductor CN1–CNn contacts and is electrically connected to conductive regions 812 and 816.

In operation, when a first potential is present on contact region 816A and a higher second potential is present on contact region 814A, a current flows from region 814A to region 814, then to region 812 via conductors CR1–CRn. From region 812, the current flows to region 816 via conductors CN1–CNn, and then to region 816A. Conductive structure 800 can be used, for example, as a buried resistor or a test structure for measuring the performance of the channel stop implant.

When used as a test structure, the trenches, including the "H" shaped trench TI, are formed at the same time that the trenches are formed for the trench isolation regions. In addition, the "H" shaped conductive region 812 is formed at the same time that the channel stop implants are formed for the trench isolation regions.

Thus, the horizontal portion of conductive region 812 (which lies below the horizontal bar of the "H" shaped trench TI) can serve as a representative sample of the channel stop implants used with the trench isolation regions, and can be tested to monitor the effective doping of the channel stop implants.

As a result, when a positive voltage is applied to contact region 814A, and contact region 816A is connected to ground, current flows through structure 800, allowing measurement of the resistivity of the horizontal portion of conductive region 812. The resistivity measurement provides data on the quality of the channel stop implants without having to physically break and stain the wafer to observe the channel stop implanted regions.

FIGS. 9A–9F2 show cross-sectional views that illustrate an example of a method of forming a conductive structure in accordance with the present invention. FIG. 9A shows a plan view, while FIGS. 9B1–9F1 and 9B2–9F2 are cross-sectional views taken along lines 9B1—9B1 and 9B2—9B2, respectively, of FIG. 9A. As shown in FIG. 9A, the method uses a conventionally formed semiconductor material 910, such as an epitaxial layer on a n-type substrate, that has spaced-apart p-type subsurface conductive regions 912 and 914, such as buried layers, formed in material 910 between the epitaxial layer and the n-type substrate.

As further shown in FIG. 9A, the method begins by forming a mask 916 on semiconductor material 910. Mask 916 is patterned to have an "H" shaped opening 918, a series of spaced apart first openings OP1–OPn that are parallel to a first vertical leg of the "H", and a series of spaced apart second openings PN1–PNn that are parallel to a second vertical leg of the "H". Each of the openings, in turn, exposes a region of the surface of material 910.

In the present example, six first openings and six second openings are utilized, each shaped like a triangle having two points adjoining opening 918 and a third point spaced apart from opening 918. (Alternatively, openings OP1–OPn and PN1–PNn can be formed as trapezoids, each having two points adjoining opening 918 and two points laterally spaced apart from opening 918). Each of the openings OP1–OPn and PN1–PNn, in turn, expose a region of the surface of material 910.

Mask openings OP1–OPn and PN1–PNn are formed to have a width W between the points of the openings in contact with the "H" shaped opening 918. Similarly, each of the vertical legs and the horizontal center bar of opening 918 have a width W. Mask 916 is part of the same mask that is used to form the trenches of the trench isolation regions that are formed on other portions of the wafer.

Next, as shown in FIGS. 9C1 and 9C2, semiconductor material 910 is anisotropically etched to remove the material not protected by mask 916. The etch forms an "H" shaped trench 920, a series of spaced apart, wedge shaped first trenches TR1–TRn that adjoin a first vertical leg of the "H", and a series of spaced apart, wedge shaped second trenches TN1–TNn that adjoin a second vertical leg of the "H". (Only trenches TR3 and TN3 are illustrated.) By using a process of aspect ratio dependent etching, the depth of each of the trenches is greatest where the trench is widest.

In the example of FIGS. 9C1–9C2, six wedge shaped first trenches and six wedge shaped second trenches are formed. (Although twelve trenches are utilized in the example, the number and configuration of trenches can be varied.) Each of the wedge shaped trenches TR1–TRn is formed to have two substantially vertical sidewalls, a sloped bottom surface 922, and an open end adjoining trench 920. (Alternately, if a trapezoidal mask opening is used, the trench will have three sidewalls).

In each of the wedge shaped trenches TR1–TRn, bottom surface 922 has a depth D1 at a shallow end 922A of the trench, and a depth D2, which is greater than D1, at a deep end 922B of the trench adjacent to trench 920. In the present example, the bottom surface 922 of each of the wedge shaped trenches TR1–TRn contacts the bottom surface of the "H" shaped trench 920.

In addition, each of the wedge shaped trenches TN1–TNn is formed to have two substantially vertical sidewalls, a sloped bottom surface 924, and an open end adjoining trench 920. (Alternately, if a trapezoidal mask opening is used, the trench will have three sidewalls). In each of the wedge shaped trenches TN1–TNn, bottom surface 924 has a depth D1 at a shallow end 924A of the trench, and a depth D2, which is greater than D1, at a deep end 924B of the trench adjacent to trench 920. In the present example, the bottom surface 924 of each of the wedge shaped trenches TN1–TNn contacts the bottom surface of the "H" shaped trench 920.

As further shown in FIGS. 9C1–9C2, after trenches TR1–TRn, TN1–TNn, and 920 have been formed, the bottom surface of trench 920 and the bottom surfaces 922 and 924 of trenches TR1–TRn and TN1–TNn are implanted with a p-type dopant, such as boron. The implant forms an "H" shaped implanted region 934 that lies below trench 920, a series of implanted regions IR1–IRn that lie below the bottom surfaces 922 of the trenches TR1–TRn, and a series of implanted regions IN1–INn that lie below the bottom surfaces 924 of trenches TN1–TNn. (Only implanted regions IR3 and IN3 are illustrated.) Each of the implanted regions IR1–IRn and each of the implanted regions IN1–INn contact implanted region 934.

Following this, mask 916 is removed. Trench 920, trenches TR1–TRn, and trenches TN1–TNn can be implanted at the same time that the channel stop is implanted below the trenches of the trench isolation regions that are formed on other portions of the wafer.

Turning to FIGS. 9D1–9D2, after mask 916 has been removed, a layer of isolation material 946, such as thermally grown oxide, is formed on semiconductor material 910, trench 920, trenches TR1–TRn, and trenches TN1–TNn to line the trenches. After trench 920, trenches TR1–TRn, and trenches TN1–TNn have been lined, a layer of filler material 948, such as oxide or polysilicon, is formed on material 946 to fill trench 920, trenches TR1–TRn, and trenches TN1–TNn. Once the trenches are filled, materials 946 and 948 are planarized to remove filler material 948 and isolation material 946 from the top surface of semiconductor material 910.

After this step, as shown in FIGS. 9E1–9E2, an insulating layer 949, such as sacrificial oxide, is formed on semiconductor material 910 and the top surfaces of the isolation material 948 in trench 920, trenches TR1–TRn, and trenches TN1–TNn. Following this, a mask 950 is formed and patterned on layer 949.

Semiconductor material 910 is then implanted with a p-type dopant to form a p-type well 956 so that the shallow ends of the bottom surfaces of trenches TR1–TRn are vertically spaced apart from well 956. The implant also forms a p-type well 958 so that the shallow ends of the bottom surfaces of trenches TN1–TNn are vertically spaced apart from well 958. Wells 956 and 958 can be formed at the same time that the p-wells are formed on other portions of the wafer. Mask 950 and sacrificial layer 949 are then removed.

As shown in FIGS. 9F1–9F2, an insulating layer 964, such as oxide, is subsequently formed on semiconductor material 910 and the top surfaces of isolation material 946 and filler material 948 in trench 920, trenches TR1–TRn, and trenches TN1–TNn. Following this, a mask 966 is formed and patterned on layer 964. (A number of intermediate steps typically take place on other portions of the wafer to form MOS and/or bipolar transistors prior to the formation of mask 966. Mask 966 is used to protect n-type regions, and expose p-type contact regions, of the wafer.)

Following this, the wafer is implanted with a p-type dopant to form a p+ region 970 in well 956 and a p+ region 972 in well 958. Following the implant, the wafer is annealed to drive in the dopants and repair lattice damage caused by the implants. The annealing process causes the dopant in implanted regions 934, IR1–IRn, and IN1–INn to diffuse out to the surrounding semiconductor material to form conductive regions 974, CR1–CRn, and CN1–CNn, respectively. (Prior thermal steps also aid in this process.)

Figure 8D:
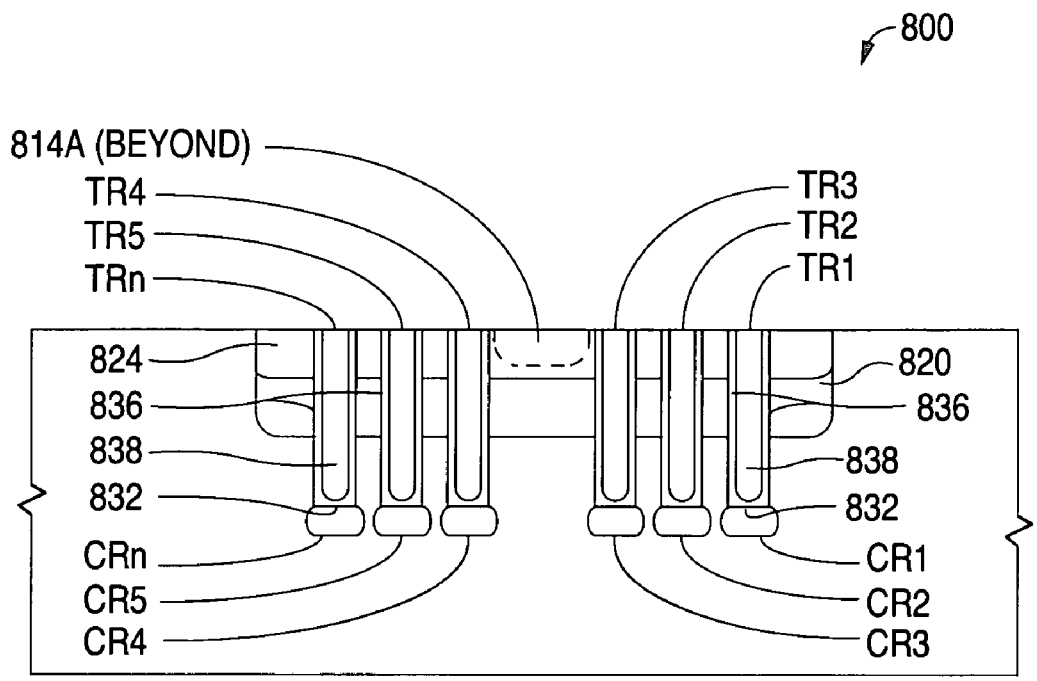
Figure 8E:
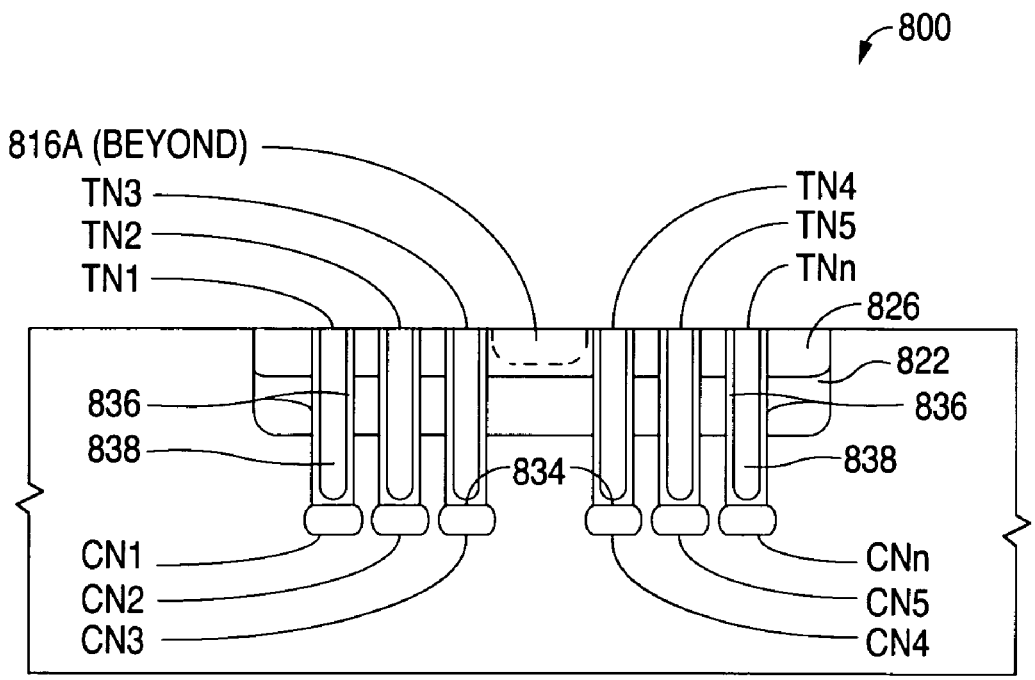

Conductive regions CR1–CRn connect conductive region 974 with conductive region 914. Additionally, conductive regions CN1–CNn connect conductive region 974 with conductive region 912. (The resulting structure in cross-section is shown in FIGS. 8D and 8E.) After the wafer has been annealed, the method continues with conventional back end processing steps.

Figure 10A:
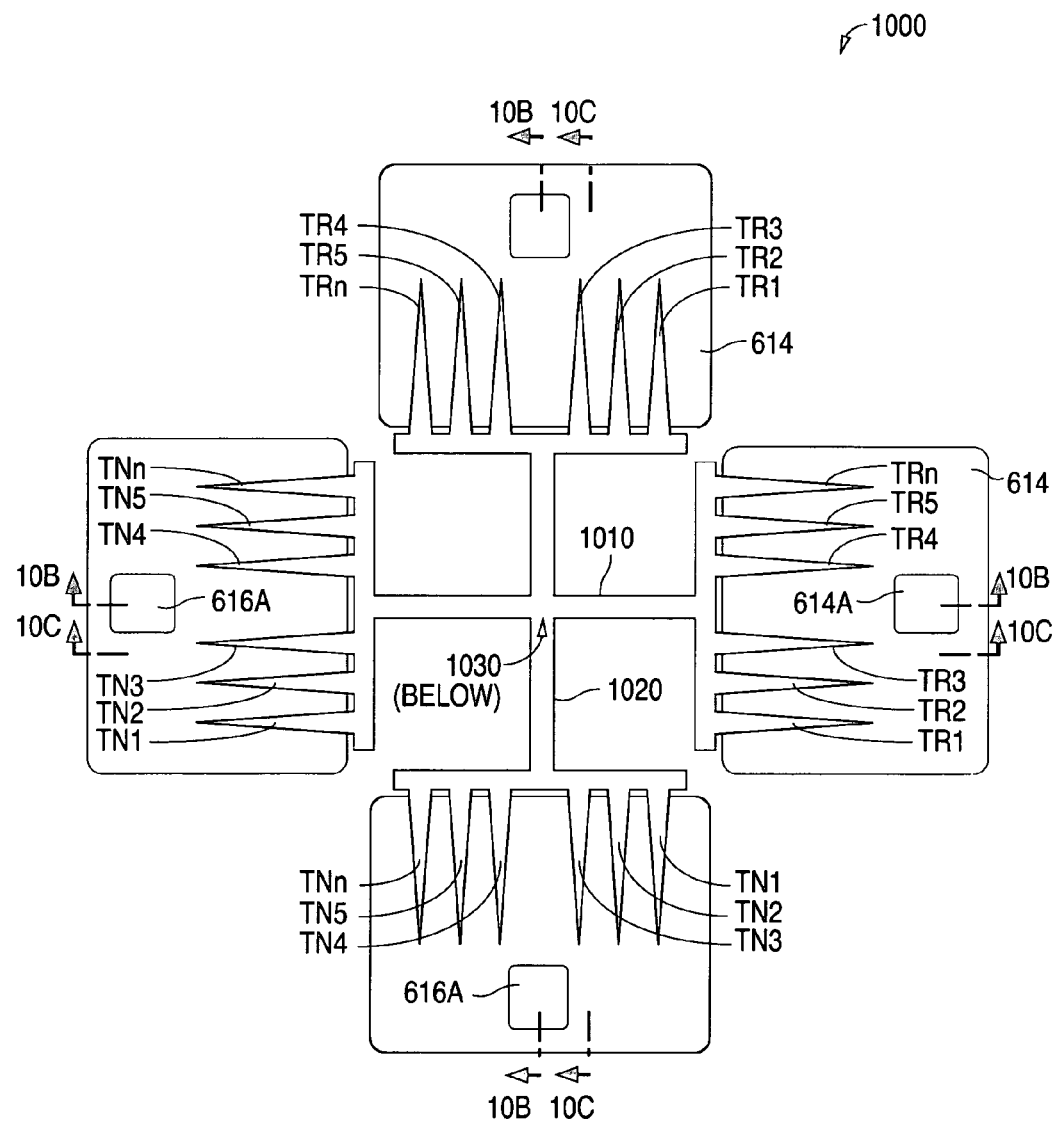

FIGS. 10A–10C show views that illustrate an example of a conductive structure 1000 in accordance with the present invention. FIG. 10A is a plan view, FIG. 10B is a cross-sectional view taken along line 10B—10B of FIG. 10A, and FIG. 10C is a cross-sectional view taken along line 10C—10C of FIG. 10A. Structure 1000 can be used as a Van der Pauw device to test the electrical resistivity of a dopant implant.

Conductive structure 1000 includes a first structure 1010 and a second structure 1020 which the same as conductive structure 600. (Structures 1010 and 1020 can alternately be the same as structure 800.) Conductive structure 1000 is formed so that the center bar of the H shaped trench in structure 1010 intersects the center bar of the H shaped trench in structure 1020, to form a symmetrical, cross-shaped structure in plan view.

Conductive structures 1010 and 1020 can also include p-type buried regions 1024 and 1026 as shown in FIG. 10B. The configuration of structure 1000 allows the Van der Pauw method to be used to test the resistivity of an implanted region 1030 that is located in the semiconductor material below the area where the H shaped trenches intersect.

In operation, contact regions 614A and 616A in structures 1010 and 1020 can be connected to a supply voltage and ground to measure the resistivity of implanted region 1030. By using the Van der Pauw test method in conjunction with structure 1000, the performance of the trench isolation regions used on other regions of the wafer can be monitored.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a conductive structure in a semiconductor material of a wafer, the semiconductor material having a top surface and a first conductive region that lies below the top surface of the semiconductor material, the first conductive region and the semiconductor material having opposite conductivity types, the method comprising the steps of:

forming a trench in the semiconductor material, the trench having a plurality of sidewalls and a bottom surface, the bottom surface of the trench being formed at different depths so that the trench has a shallow end and a deep end;

introducing dopant atoms into the bottom surface of the trench;

forming a well in the semiconductor material adjacent to the shallow end of the trench; and forming a second conductive region in the semiconductor material, the second conductive region being spaced apart from the first conductive region.

2. The method of claim 1 and further comprising the step of annealing the wafer to cause the dopant atoms at the bottom surface of the trench to diffuse and form a conductor that contacts the first conductive region and the second conductive region.

3. The method of claim 2 wherein the conductor lies below the top surface of the semiconductor material.

4. A method of forming a conductive structure in a semiconductor material, the semiconductor material having a top surface and a first conductivity type, the method comprising the steps of:

forming a trench in the semiconductor material, the trench having a plurality of sidewalls and a bottom surface, the bottom surface of the trench extending from a deepest region to a shallowest region, the deepest region extending from a first sidewall to a second sidewall along a first line, a distance from the deepest region to the shallowest region measured along a second line normal to the first line being greater than a length of the first line; and introducing dopant atoms of a second conductivity type into the bottom surface of the trench to form a conductive region in the semiconductor material that has a shallow end and a deep end.

5. The method of claim 4 and further comprising the step of forming a well of the second conductivity type in the semiconductor material, the well contacting the top surface of the semiconductor material and the shallow end of the conductive region, and being spaced apart from the deep end of the conductive region.

6. The method of claim 5 wherein the conductive structure includes a conducting region of the second conductivity type, the conducting region lying below and being spaced apart from the top surface of the semiconductor material, and contacting the deep end of the conductive region.

7. The method of claim 5 wherein the bottom surface of the trench has a flat region, the flat region having a substantially uniform depth below the top surface of the semiconductor material.

8. The method of claim 4 and further comprising the step of forming a well of the second conductivity type in the semiconductor material, the well contacting the top surface of the semiconductor material, and being spaced apart from the conductive region.

9. The method of claim 8 wherein the conductive structure includes a conducting region of the second conductivity type, the conducting region lying below and being spaced apart from the top surface of the semiconductor material, and contacting the shallow end of the conductive region.

10. The method of claim 9 wherein the bottom surface of the trench has a flat region, the flat region having a substantially uniform depth below the top surface of the semiconductor material.

11. The method of claim 8 and further comprising the step of forming a sinker of the second conductivity type in the semiconductor material, the sinker contacting the well and the conducting region.

12. A method of forming a conductive structure in a semiconductor material, the semiconductor material having a top surface and a first conductivity type, the method comprising the steps of:

forming a trench in the semiconductor material, the trench having a plurality of sidewalls and a bottom surface, the bottom surface of the trench being formed at different depths so that the trench has a shallow end and a deep end, the trench having:

a flat region, the flat region having a first side, a second side that opposes the first side, a third side, a fourth side that opposes the third side, and a substantially uniform depth below the top surface of the semiconductor material;

a plurality of first finger regions that contact the first side of the flat region, each first finger region having a shallow end and a deep end; and a plurality of second finger regions that contact the second side of the flat region, each second finger region having a shallow end and a deep end; and introducing dopant atoms of a second conductivity type into the bottom surface of the trench to form a conductive region in the semiconductor material that has a shallow end and a deep end.

13. The method of claim 12 wherein the conductive region has:

a flat conductive region lying below the flat region;

a plurality of first conductive regions that lie below the plurality of first finger regions, each first conductive region having a shallow end and a deep end; and a plurality of second conductive regions that lie below the plurality of second finger regions, each second conductive region having a shallow end and a deep end.

14. The method of claim 13 and further comprising the step of:

forming a first well of the second conductivity type in the semiconductor material, the first well contacting the top surface of the semiconductor material and the shallow ends of the plurality of first conductive regions, and being spaced apart from the deep ends of the plurality of first conductive regions; and forming a second well of the second conductivity type in the semiconductor material, the second well being spaced apart from the first well, contacting the top surface of the semiconductor material and the shallow ends of the plurality of second conductive regions, and being spaced apart from the deep ends of the plurality of second conductive regions.

15. The method of claim 13 and further comprising the step of:

forming a first well of the second conductivity type in the semiconductor material, the first well contacting the top surface of the semiconductor material, and lying over and being spaced apart from the plurality of first conductive regions; and forming a second well of the second conductivity type in the semiconductor material, the second well contacting the top surface of the semiconductor material, and lying over and being spaced apart from the second conductive regions.

16. The method of claim 15 wherein the conductive structure includes:

a first conducting region of the second conductivity type, the first conducting region lying below and being spaced apart from the top surface of the semiconductor material, and contacting the shallow ends of the plurality of first conductive regions; and a second conducting region of the second conductivity type, the second conducting region lying below and being spaced apart from the top surface of the semiconductor material, and contacting the shallow ends of the plurality of second conductive regions.

17. The method of claim 12 wherein the trench has:

a plurality of third finger regions that contact the third side of the flat region, each third finger region having a shallow end and a deep end; and a plurality of fourth finger regions that contact the fourth side of the flat region, each fourth finger region having a shallow end and a deep end.

18. The method of claim 17 wherein the conductive region has:

a flat conductive region lying below the flat region;

a plurality of first conductive regions that lie below the plurality of first finger regions, each first conductive region having a shallow end and a deep end;

a plurality of second conductive regions that lie below the plurality of second finger regions, each second conductive region having a shallow end and a deep end;

a plurality of first conductive regions that lie below the plurality of first finger regions, each first conductive region having a shallow end and a deep end; and a plurality of second conductive regions that lie below the plurality of second finger regions, each second conductive region having a shallow end and a deep end.

* * * * *